(12) United States Patent
Ori et al.

(10) Patent No.: US 10,925,170 B2
(45) Date of Patent: *Feb. 16, 2021

(54) SURFACE TREATED COPPER FOIL, SURFACE TREATED COPPER FOIL WITH RESIN LAYER, COPPER FOIL WITH CARRIER, LAMINATE, METHOD FOR MANUFACTURING PRINTED WIRING BOARD, AND METHOD FOR MANUFACTURING ELECTRONIC DEVICE

(71) Applicant: JX Nippon Mining & Metals Corporation, Tokyo (JP)

(72) Inventors: Yuki Ori, Ibaraki (JP); Hideta Arai, Ibaraki (JP); Atsushi Miki, Ibaraki (JP); Ryo Fukuchi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 25 days.

This patent is subject to a terminal disclaimer.

(21) Appl. No.: 15/923,024

(22) Filed: Mar. 16, 2018

(65) Prior Publication Data

US 2018/0288881 A1 Oct. 4, 2018

(30) Foreign Application Priority Data

Mar. 31, 2017 (JP) ................................ 2017-070418

(51) Int. Cl.
C25D 7/04 (2006.01)
H05K 3/22 (2006.01)
(Continued)

(52) U.S. Cl.
CPC ................. *H05K 3/22* (2013.01); *C25D 5/10* (2013.01); *C25D 5/12* (2013.01); *C25D 5/16* (2013.01);
(Continued)

(58) Field of Classification Search
None
See application file for complete search history.

(56) References Cited

U.S. PATENT DOCUMENTS

2013/0040162 A1 2/2013 Fujisawa et al.
2014/0355229 A1* 12/2014 Arai ..................... C25D 1/04
361/751
(Continued)

FOREIGN PATENT DOCUMENTS

CN 105835478 A 8/2016
CN 106455341 A 2/2017
(Continued)

OTHER PUBLICATIONS

Korean communication, with English translation, dated Sep. 4, 2019 in corresponding Korean patent application No. 10-2018-0035590.
(Continued)

*Primary Examiner* — Seth Dumbris
(74) *Attorney, Agent, or Firm* — Nields, Lemack & Frame, LLC

(57) ABSTRACT

The present invention provides a surface treated copper foil in which a dropping of the roughening particles from a roughening treatment layer provided on the surface of the copper foil is favorably suppressed and an occurrence of wrinkles or stripes when bonding with an insulating substrate is favorably suppressed.

The surface treated copper foil comprises a copper foil, and
a roughening treatment layer on at least one surface of the copper foil,
wherein an aspect ratio of roughening particles of the roughening treatment layer satisfies one or more of the following items (1) and (2), the aspect ratio being a height of the roughening particles/a thickness of the roughening particles:
(1) the aspect ratio of the roughening particles is 3 or less,
(Continued)

(2) the aspect ratio of the roughening particles satisfies any one of the following items (2-1) or (2-2):

(2-1) the aspect ratio of the roughening particles is 10 or less in the case that the height of the roughening particles is more than 500 nm and 1000 nm or less, (2-2) the aspect ratio of the roughening particles is 15 or less in the case that the height of the roughening particles is 500 nm or less; and a glossiness of a TD of the surface of the side of the roughening treatment layer of the surface treated copper foil is 70% or less.

25 Claims, 5 Drawing Sheets

(51) Int. Cl.
| | |
|---|---|
| *H05K 1/09* | (2006.01) |
| *H05K 3/46* | (2006.01) |
| *C25D 5/16* | (2006.01) |
| *H05K 3/38* | (2006.01) |
| *C25D 7/06* | (2006.01) |
| *C25D 5/12* | (2006.01) |
| *C25D 5/10* | (2006.01) |
| *C25D 7/00* | (2006.01) |
| *C25D 3/38* | (2006.01) |
| *C25D 3/56* | (2006.01) |
| *H05K 3/20* | (2006.01) |
| *C25D 1/04* | (2006.01) |
| *C25D 3/58* | (2006.01) |
| *C25D 11/38* | (2006.01) |
| *C25D 3/12* | (2006.01) |
| *C25D 5/02* | (2006.01) |

(52) U.S. Cl.
CPC .............. *C25D 7/00* (2013.01); *C25D 7/0614* (2013.01); *H05K 1/09* (2013.01); *H05K 3/384* (2013.01); *H05K 3/4652* (2013.01); *H05K 3/4682* (2013.01); *C25D 1/04* (2013.01); *C25D 3/12* (2013.01); *C25D 3/38* (2013.01); *C25D 3/562* (2013.01); *C25D 3/58* (2013.01); *C25D 5/022* (2013.01); *C25D 11/38* (2013.01); *H05K 3/205* (2013.01); *H05K 3/389* (2013.01); *H05K 2201/0154* (2013.01); *H05K 2201/0338* (2013.01); *H05K 2201/0355* (2013.01); *H05K 2203/0156* (2013.01); *H05K 2203/0307* (2013.01); *H05K 2203/0723* (2013.01); *Y10T 428/12431* (2015.01)

(56) References Cited

U.S. PATENT DOCUMENTS

| | | | |
|---|---|---|---|
| 2015/0047884 A1* | 2/2015 | Nagaura | ............... H05K 3/388 174/255 |
| 2015/0237737 A1 | 8/2015 | Arai et al. | |
| 2016/0183380 A1 | 6/2016 | Ishii et al. | |
| 2016/0212836 A1 | 7/2016 | Arai et al. | |
| 2016/0234935 A1 | 8/2016 | Kohiki | |
| 2016/0303829 A1 | 10/2016 | Arai et al. | |
| 2017/0042025 A1 | 2/2017 | Miyamoto | |
| 2018/0288884 A1 | 10/2018 | Ori et al. | |

FOREIGN PATENT DOCUMENTS

| | | | |
|---|---|---|---|
| JP | 2849059 B2 | 1/1999 | |
| JP | 2015-26654 A | 2/2015 | |
| JP | 2015-92013 A | 5/2015 | |
| KR | 10-2012-0135197 A | 12/2012 | |
| KR | 10-2015-0021474 A | 3/2015 | |
| KR | 10-2016-0052528 A | 5/2016 | |
| TW | 201429703 A | 8/2014 | |
| TW | 201518078 A | 5/2015 | |
| TW | 201531172 A | 8/2015 | |
| TW | 201644333 A | 12/2016 | |
| WO | WO-2013108414 A1 * | 7/2013 | ............ B32B 15/20 |
| WO | 2014/081041 A1 | 5/2014 | |
| WO | 2015/012327 A1 | 1/2015 | |

OTHER PUBLICATIONS

Office action dated Oct. 3, 2019 in co-pending U.S. Appl. No. 15/936,600.
Final rejection dated Mar. 16, 2020 in co-pending U.S. Appl. No. 15/936,600.
Office action dated Dec. 6, 2019 in co-pending U.S. Appl. No. 15/936,600.
Office action dated Jul. 23, 2020 in co-pending U.S. Appl. No. 15/936,600.
Notice of allowance dated Oct. 23, 2020 in co-pending U.S. Appl. No. 15/936,600.

* cited by examiner

EXPOSURE AND DEVELOPMENT.

CIRCUIT PLATING AND RESIST REMOVAL.

LAMINATE OF RESIN AND COPPER FOIL WITH CARRIER

SECOND-LAYER CARRIER FOIL RELEASE

LASER HOLE DRILLING

VIA FILL

SECOND-LAYER CIRCUIT PLATING

FIRST-LAYER CARRIER FOIL RELEASE

FLASH ETCHING

BUMP AND COPPER PILLAR FORMATION

Note 1:
One point at which a convex portion of roughening particle starts to develop from surface of copper foil.

Note 2:
The other point at which a convex portion of roughening particle starts to develop from surface of copper foil.

SURFACE TREATED COPPER FOIL, SURFACE TREATED COPPER FOIL WITH RESIN LAYER, COPPER FOIL WITH CARRIER, LAMINATE, METHOD FOR MANUFACTURING PRINTED WIRING BOARD, AND METHOD FOR MANUFACTURING ELECTRONIC DEVICE

TECHNICAL FIELD

The present invention is related to a surface treated copper foil, a surface treated copper foil with resin layer, a copper foil with carrier, a laminate, a method for manufacturing a printed wiring board and a method for manufacturing an electronic device.

BACKGROUND ART

Printed wiring boards have made significant progress over the last half century and have been used to almost all electronic devices nowadays. Along with the recent trend toward miniaturization and high performance of electronic device, high density mounting of mounted parts have progressed, and miniaturization of conductor patterns (fine pitch) is required for printed wiring boards.

The printed wiring board is firstly manufactured as a copper clad laminate in which a copper foil and an insulating substrate mainly composed of a glass epoxy substrate, a BT resin, a polyimide film or the like are bonded. As a bonding method, a method of laminating an insulating substrate and a copper foil by overlapping and then heating and pressurizing the insulating substrate and the copper foil (lamination method), or a method of applying a varnish, which is a precursor of the insulating substrate material, on the surface on which a coating layer exists, and then heating and curing them (casting method), is used.

In order to solve the above-described problem of fine pitch, for example, Patent Document 1 discloses a processing method for copper foil for printed circuit, characterized by subjecting a copper foil surface to a roughening treatment using a copper-cobalt-nickel alloy plating, and then forming a cobalt-nickel alloy plating layer, and further forming a zinc-nickel alloy plating layer. Patent Document 1 also discloses that according to such a configuration, fine pitch of the conductor pattern can be achieved.

CITATION LIST

Patent Literature

[PTL 1] Japanese Patent No. 2849059

SUMMARY OF INVENTION

Problem to be Solved by the Present Invention

In the method for manufacturing a printed wiring board as described above, contamination on the surface of the copper foil or on the surface of the printed wiring board may be removed by using a predetermined device or the like. The roughening treatment layer, which is applied to the surface of the copper foil in order to improve the adhesion to the insulating resin, becomes finer so as to accomplish the abovementioned miniaturization of the wiring. As a result, when the abovementioned contamination is removed, the roughening particles constituting the roughening treatment layer drop off from the surface of the copper foil (also referred to as particle dropping) and are transferred and adhered to the copper foil or to the conveying device of the printed wiring board, as a conductive contamination. The conductive contamination adhered to the surface of the copper foil or the conveying device of the printed wiring board as described above may move again to the surface of the copper foil or the printed wiring board. In such a case, when a circuit is formed using the copper foil, a short circuit may occur in the printed wiring board.

However, in a surface treated copper foil having a roughening treatment layer, sufficient studies have not been made on the technique for favorably suppressing the dropping of the roughening particles (particle dropping) and there is still room for improvement. Further, when a printed wiring board or the like are produced by using a surface treated copper foil, a laminate may be produced by bonding the surface treated copper foil and a resin. There is a problem that wrinkles or stripes occur when bonding the surface treated copper foil and an insulating substrate such as the resin. The abovementioned wrinkles or stripes tend to occur when the roughening treatment layer is fine. Such problems when bonding with the insulating substrate should be also improved. Accordingly, the object of the present invention is to provide a surface treated copper foil in which the dropping of the roughening particles from the roughening treatment layer provided on the surface of the copper foil is favorably suppressed and an occurrence of wrinkles or stripes when bonding with the insulating substrate is favorably suppressed.

Solution to Problem

In order to achieve the above object, the inventors of the present invention have conducted intensive studies and have found that this problem can be solved by configuring the aspect ratio of roughening particles of the roughening treatment layer from the surface of the copper foil to be in a predetermined value, and controlling the glossiness of the TD of the surface of the side of the roughening treatment layer of the surface treated copper foil to a predetermined value or less.

One or more embodiments of the present application have been completed based on the aforementioned knowledge, and relate to, in one aspect, a surface treated copper foil, comprising a copper foil, and a roughening treatment layer on at least one surface of the copper foil, wherein an aspect ratio of roughening particles of the roughening treatment layer satisfies one or more of the following items (1) and (2), the aspect ratio being "a height of the roughening particles"/ "a thickness of the roughening particles":
  (1) the aspect ratio of the roughening particles is 3 or less,
  (2) the aspect ratio of the roughening particles satisfies any one of the following items (2-1) or (2-2):
    (2-1) the aspect ratio of the roughening particles is 10 or less in the case that the height of the roughening particles is more than 500 nm and 1000 nm or less,
    (2-2) the aspect ratio of the roughening particles is 15 or less in the case that the height of the roughening particles is 500 nm or less; and
  a glossiness of a TD of the surface of the side of the roughening treatment layer of the surface treated copper foil is 70% or less.

In one embodiment of the surface-treated copper foil of the present application, a color difference $\Delta E^{*}ab$ according to JIS Z 8730 of a surface of a side of the roughening treatment layer of the surface treated copper foil is 65 or less.

In another embodiment of the surface-treated copper foil of the present application, the height of the roughening particles is 1000 nm or more and the aspect ratio of the roughening particles is 3.0 or less.

In still another embodiment of the surface-treated copper foil of the present application, the height of the roughening particles is 500 nm or more and the aspect ratio of the roughening particles is 10.0 or less.

In still another embodiment of the surface-treated copper foil of the present application, the height of the roughening particles is 500 nm or less and the aspect ratio of the roughening particles is 1.9 or less.

In still another embodiment of the surface-treated copper foil of the present application, the aspect ratio of the roughening particles satisfies one or more of the items (1) and (2-2), and the height of the roughening particles is 400 nm or less.

In still another embodiment of the surface-treated copper foil of the present application, the height of the roughening particles is 1200 nm or less.

In still another embodiment of the surface-treated copper foil of the present application, the color difference ΔE*ab according to JIS Z 8730 of the surface of the side of the roughening treatment layer is 45 or more and 65 or less.

In still another embodiment of the surface-treated copper foil of the present application, the color difference ΔE*ab according to JIS Z 8730 of the surface of the side of the roughening treatment layer is 50.0 or less.

In still another embodiment of the surface-treated copper foil of the present application, the glossiness of the TD of the surface of the side of the roughening treatment layer is 21% or more.

In still another embodiment of the surface-treated copper foil of the present application, the surface-treated copper foil comprises, on the surface of the roughening treated layer, one or more layers selected from the group consisting of a heat resistant layer, a rust preventive layer, a chromate treatment layer and a silane coupling treatment layer.

In still another embodiment of the surface-treated copper foil of the present application, the surface treated copper foil is for heat dissipation.

One or more embodiments of the present application also relates to, in another aspect, a surface treated copper foil with resin layer, comprising the surface treated copper foil according to one or more embodiments of the present application, and a resin layer on the surface of the side of the roughening treatment layer.

In another embodiment of the surface treated copper foil with resin layer of the present application, the resin layer is an adhesive resin and/or a semi-cured resin.

One or more embodiments of the present application also relates to, in still another aspect, a copper foil with carrier, comprising a carrier, an intermediate layer, and an ultra-thin copper layer, wherein the ultra-thin copper layer is the surface treated copper foil according to one or more embodiments of the present application or the surface treated copper foil with resin layer according to one or more embodiments of the present application.

One or more embodiments of the present application also relates to, in still another aspect, a laminate, comprising the surface treated copper foil according to one or more embodiments of the present application or the surface treated copper foil with resin layer according to one or more embodiments of the present application.

One or more embodiments of the present application also relates to, in still another aspect, a laminate, comprising the copper foil with carrier according to one or more embodiments of the present application.

One or more embodiments of the present application also relates to, in still another aspect, a laminate, comprising the copper foil with carrier according to one or more embodiments of the present application and a resin, wherein a part or the whole of an end face of the copper foil with carrier is covered with the resin.

One or more embodiments of the present application also relates to, in still another aspect, a laminate, comprising two of the copper foils with carrier according to one or more embodiments of the present application.

One or more embodiments of the present application also relates to, in still another aspect, a method for manufacturing a printed wiring board, using the surface treated copper foil according to one or more embodiments of the present application, the surface treated copper foil with resin layer according to one or more embodiments of the present application, or the copper foil with carrier according to one or more embodiments of the present application.

One or more embodiments of the present application also relates to, in still another aspect, a method for manufacturing a printed wiring board, comprising a step of forming a copper clad laminate comprising any one of the following steps (21-1) to (21-3):

(21-1) a step of laminating the surface treated copper foil according to one or more embodiments of the present application and an insulating substrate, (21-2) a step of laminating the surface treated copper foil with resin layer according to one or more embodiments of the present application and an insulating substrate, (21-3) a step of laminating the copper foil with carrier according to one or more embodiments of the present application and an insulating substrate, and then peeling off the carrier of the copper foil with carrier; and a step of forming a circuit by a semi-additive method, a subtractive method, a partly additive method or a modified semi-additive method using the copper clad laminate.

One or more embodiments of the present application also relates to, in still another aspect, a method for manufacturing a printed wiring board, comprising a step of forming a circuit on the surface treated copper foil according to one or more embodiments of the present application, or on a surface of the copper foil with carrier according to one or more embodiments of the present application, a step of forming a resin layer on the surface of the surfaced treated copper foil, or on the surface of the copper foil with the carrier, so that the circuit is embedded in the resin layer, a step of forming a circuit on the resin layer, and after forming the circuit on the resin layer, a step of exposing the circuit embedded in the resin layer by removing the surface treated copper foil, or by peeling off the carrier or the ultra-thin copper layer and then removing the ultra-thin copper layer or the carrier.

One or more embodiments of the present application also relates to, in still another aspect, a method for manufacturing a printed wiring board, comprising a step of laminating the surface treated copper foil according to one or more embodiments of the present application or the copper foil with carrier according to one or more embodiments of the present application, and a resin substrate, a step of forming a circuit on a surface of the surface treated copper foil or on a surface of the copper foil with carrier, the surfaces of the surface treated copper foil and the copper foil with carrier being on the side opposite to the side on which the resin substrate is laminated, a step of forming a resin layer on the surface of the surfaced treated copper foil, or on the surface of the copper foil with the carrier, the surfaces of the surface treated copper foil and the copper foil with carrier being on the side opposite to the side on which the resin substrate is laminated, so that the circuit is embedded in the resin layer, a step of forming a circuit on the resin layer, and after forming the circuit on the resin layer, a step of exposing the circuit embedded in the resin layer by removing the surface treated copper foil, or by peeling off the carrier or the ultra-thin copper layer and then removing the ultra-thin copper layer or the carrier.

One or more embodiments of the present application also relates to, in still another aspect, a method for manufacturing a printed wiring board, comprising a step of laminating the surface treated copper foil according to one or more embodiments of the present application or the copper foil with carrier according to one or more embodiments of the present application and a resin substrate, a step of forming, at least once, a resin layer and a circuit on a surface of the surface treated copper foil or the copper foil with carrier, the surface being on the side opposite to the side on which the resin substrate is laminated, and after forming the resin layer and the circuit, a step of removing the surface treated copper foil or peeling off the carrier or the ultra-thin copper layer from the copper foil with carrier.

One or more embodiments of the present application also relates to, in still another aspect, a method for manufacturing a printed wiring board, comprising a step of forming, at least once, a resin layer and a circuit on at least one of surfaces of the laminate according to one or more embodiments of the present application, and after forming the resin layer and the circuit, a step of peeling off the carrier or the ultra-thin copper layer from the copper foil with carrier constituting the laminate.

One or more embodiments of the present application also relates to, in still another aspect, a method for manufacturing an electronic device, using a printed wiring board manufactured by the method according to one or more embodiments of the present application.

Advantageous Effect of Invention

According to one or more embodiments of the present application, a surface treated copper foil, in which the dropping of the roughening particles from the roughening treatment layer provided on the surface of the copper foil is favorably suppressed and an occurrence of wrinkles or stripes when bonding with the insulating substrate is favorably suppressed, can be provided.

DESCRIPTION OF EMBODIMENTS

<Surface Treated Copper Foil>

Figure 1A:
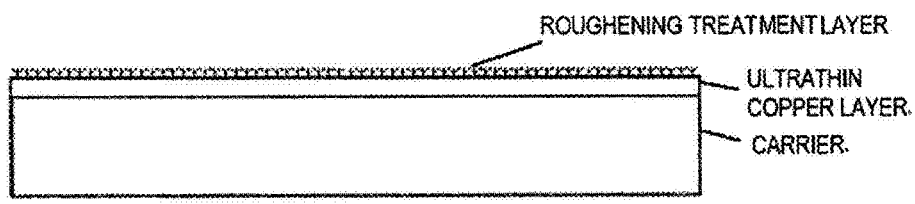
FIGS. 1A, 1B and 1C are schematic diagrams of a cross section of a wiring board in a process until circuit plating and removing resist, according to one embodiment of the method for manufacturing a printed wiring board using the copper foil with carrier according to the present application.

In the surface treated copper foil according to one or more embodiments of the present application, a roughening treated layer is provided on one surface and/or both surfaces of a copper foil. In the present application, when the surface of the copper foil is subjected to a surface treatment (i.e. an underlying plating such as a copper plating) (for example, the surface treated copper foil treated in the order of copper foil/surface treatment/roughening treatment), the one "surface" and/or the both "surfaces" of the copper foil refer to the surface after the surface treatment (the outermost surface). A printed wiring board can be finally manufactured by laminating the surface treated copper foil according to the present application to an insulating substrate to produce a laminate (a copper clad laminate), and then etching the surface treated copper foil into a target conductor pattern. The surface treated copper foil according to the present application may be used, for example, as a surface treated copper foil for heat dissipation which is capable of receiving heat from a heat-generating member and releasing it favorably.

<Copper Foil>

There is no particular limitation on the form of the copper foil which can be used in the present application. Typically, the copper foil used in the present application may be either an electrolytic copper foil or a rolled copper foil. Generally, an electrolytic copper foil is manufactured by electrodepositing copper on a titanium drum or a stainless drum from in copper sulfate plating bath, and a rolled copper foil is manufactured by repeating plastic working with a rolling roll and heat treatment. Rolled copper foil is often used for applications requiring flexibility.

As to the copper foil material, high purity copper such as tough pitch copper (JIS H 3100 alloy number C1100) or oxygen free copper (JIS H 3100 alloy number C1020 or JIS H 3510 alloy number C1011) are normally used for the conductor pattern of printed wiring boards. Besides, for example, copper containing Sn, copper containing Ag, copper alloy to which Cr, Zr, Mg or the like is added, or Corson type copper alloy to which Ni, Si and the like are added, also can be used. In this specification, when the term "copper foil" is used alone, it also includes a copper alloy foil.

Besides, although the thickness of the copper foil is not particularly limited, it is preferably in the range of 1 to 1000 μm, or 1 to 500 μm, or 1 to 300 μm, or 3 to 100 μm, or 5 to 70 μm, or 6 to 35 μm, or 9 to 18 μm.

Further, according to another aspect, one or more embodiments of the present application is a copper foil with carrier comprising a carrier, an intermediate layer, an ultra-thin copper layer in this order, wherein the ultra-thin copper layer is the surface treated copper foil according to the present application. According to the present application, when using a copper foil with carrier, a surface treatment layer such as a roughening treatment layer described later is provided on the surface of the ultra-thin copper layer. Other embodiments of a copper foil with carrier will also be described later.

<Roughening Treatment Layer>

Normally, on the surface of the copper foil which is to be bonded to a resin substrate, that is, on the roughened surface, for the purpose of improving the peeling strength of the copper foil after lamination, and on the surface of the copper foil after degreasing, a roughening treatment is carried out by conducting electrodeposition in the form of "knobs". Although the electrolytic copper foil has irregularities at the time of manufacture, the roughening treatment enhances the convex portion of the electrodeposited copper foil to further increase the irregularities. As a pretreatment before roughening, ordinary copper plating or the like may be performed, and as a finishing treatment after roughening, ordinary copper plating or the like may be performed in order to prevent dropping of the electrodeposit. According to the present application, such pretreatment and finishing treatment are all referred to as "roughening treatment".

In the surface treated copper foil according to one or more embodiments of the present application, an aspect ratio of roughening particles of the roughening treatment layer satisfies one or more of the following items (1) and (2), the aspect ratio being "a height of the roughening particles"/"a thickness of the roughening particles":
 (1) the aspect ratio of the roughening particles is 3 or less,
 (2) the aspect ratio of the roughening particles satisfies any one of the following items (2-1) or (2-2):
  (2-1) the aspect ratio of the roughening particles is 10 or less in the case that the height of the roughening particles is more than 500 nm and 1000 nm or less,
  (2-2) the aspect ratio of the roughening particles is 15 or less in the case that the height of the roughening particles is 500 nm or less.

With such a configuration, it is possible to favorably control particle dropping while ensuring adhesion with the insulating resin on the surface of the copper foil.

With respect to the above item (1), it is preferable that the aspect ratio of the roughening particles is 2.9 or less, more preferably 2.8 or less, still more preferably 2.7 or less, still more preferably 2.6 or less, still more preferably 2.5 or less, still more preferably 2.4 or less, still more preferably 2.3 or less, still more preferably 2.2 or less, still more preferably 2.1 or less, still more preferably 2.0 or less. Further, with respect to the above item (1), it is preferable that the aspect ratio of the roughening particles is 0.1 or more, more preferably 0.2 or more, still more preferably 0.3 or more, still more preferably 0.4 or more, still more preferably 0.5 or more, still more preferably 0.6 or more, still more preferably 0.7 or more, still more preferably 0.8 or more, still more preferably 0.9 or more, still more preferably 1.0 or more, still more preferably 1.1 or more, still more preferably 1.2 or more, still more preferably 1.3 or more, still more preferably 1.4 or more, still more preferably 1.5 or more, still more preferably 1.6 or more.

With respect to the above item (2-1), in the case that the height of the roughening particles is more than 500 nm and 1000 nm or less, it is preferable that the aspect ratio of the roughening particles is 9.5 or less, more preferably 9.0 or less, still more preferably 8.5 or less, still more preferably 8.0 or less, still more preferably 7.5 or less, still more preferably 7.0 or less, still more preferably 6.5 or less, still more preferably 6.4 or less, still more preferably 6.3 or less, still more preferably 6.2 or less, still more preferably 6.1 or less, still more preferably 6.0 or less, still more preferably 5.9 or less, still more preferably 5.5 or less, still more preferably 5.0 or less, still more preferably 4.5 or less. With respect to the above item (2-1), in the case that the height of the roughening particles is more than 500 nm and 1000 nm or less, it is preferable that the aspect ratio of the roughening particles is 0.1 or more, more preferably 0.5 or more, still more preferably 1.0 or more, still more preferably 1.5 or more, still more preferably 1.7 or more, still more preferably 1.9 or more, still more preferably 2.1 or more, still more preferably 2.3 or more, still more preferably 2.6 or more, still more preferably 2.9 or more, still more preferably 3.2 or more, still more preferably 3.5 or more, still more preferably 3.8 or more. With respect to the above item (2-2), in the case that the height of the roughening particles is 500 nm or less, it is preferable that the aspect ratio of the roughening particles is 14.5 or less, more preferably 14.0 or less, still more preferably 13.9 or less, still more preferably 13.8 or less, still more preferably 13.5 or less, still more preferably 13.0 or less, still more preferably 12.5 or less, still more preferably 12.0 or less, still more preferably 11.5 or less, still more preferably 11.0 or less, still more preferably 10.5 or less, still more preferably 10.0 or less, still more preferably 9.5 or less, still more preferably 9.0 or less, still more preferably 8.5 or less, still more preferably 8.0 or less, still more preferably 7.5 or less, still more preferably 7.0 or less, still more preferably 6.6 or less, still more preferably 6.5 or less, still more preferably 6.4 or less, still more preferably 6.3 or less, still more preferably 6.2 or less, still more preferably 6.1 or less, still more preferably 6.0 or less, still more preferably 5.9 or less, still more preferably 5.8 or less, still more preferably 5.7 or less, still more preferably 5.6 or less, still more preferably 5.5 or less, still more preferably 5.4 or less, still more preferably 5.3 or less, still more preferably 5.2 or less, still more preferably 5.1 or less, still more preferably 5.0 or less, still more preferably 4.9 or less, still more preferably 4.8 or less, still more preferably 4.7 or less, still more preferably 4.6 or less, still more preferably 4.5 or less, still more preferably 4.2 or less, still more preferably 3.9 or less, still more preferably 3.6 or less, still more preferably 3.4 or less, still more preferably 3.3 or less, still more preferably 3.0 or less, still more preferably 2.7 or less, still more preferably 2.5 or less, still more preferably 2.4 or less, still more preferably 2.3 or less, still more preferably 1.9 or less.

With respect to the above item (2-2), in the case that the height of the roughening particles is 500 nm or less, it is preferable that the aspect ratio of the roughening particles is 0.1 or more, more preferably 0.5 or more, still more preferably 1.0 or more, still more preferably 1.5 or more, still more preferably 1.7 or more, still more preferably 1.9 or more, still more preferably 2.1 or more, still more preferably 2.3 or more, still more preferably 2.6 or more, still more preferably 2.9 or more, still more preferably 3.2 or more, still more preferably 3.5 or more, still more preferably 3.8 or more.

In the case that the roughening particles have about the same thickness, the roughening particles may be more difficult to break and the particle dropping may be further suppressed by controlling the upper limit of the aspect ratio of the roughening particles as described above. Further, the adhesion between the surface treated copper foil and the resin substrate may be improved by controlling the lower limit of the aspect ratio of the roughening particles as described above.

The thickness of the roughening particles of the roughening treatment layer of the surface treated copper foil according to one or more embodiments of the present application may not be particularly limited, and is typically, for example, 5 nm or more, for example, 10 nm or more, and for example, 13 nm or more. The thickness of the roughening particles of the roughening treatment layer of the surface treated copper foil according to one or more embodiments of the present application may not be particularly limited, and is typically, for example, 1200 nm or less, for example, 1100 nm or less, for example, 1000 nm or less, for example, 900 nm or less, for example, 800 nm or less, for example, 700 nm or less, for example, 600 nm or less, for example, 500 nm or less, and for example, 400 nm or less. Further, the roughening particles may be stacked.

In the case that the height of roughening particles of the roughening treatment layer is 1000 nm or more, the roughening particles may be likely to break and the particle dropping may be likely to occur. Accordingly, the aspect ratio of roughening particles (the height of the roughening particles/the thickness of the roughening particles) is preferably 3.0 or less, more preferably 2.9 or less, still more preferably 2.8 or less, still more preferably 2.7 or less, still more preferably 2.6 or less, still more preferably 2.5 or less, still more preferably 2.4 or less, still more preferably 2.3 or less, still more preferably 2.2 or less, still more preferably 2.1 or less, still more preferably 2.0 or less. The roughening particles can be more difficult to break and the particle dropping can be more difficult to occur by controlling the aspect ratio of the roughening particles to the above described range.

In the case that the height of roughening particles of the roughening treatment layer is 500 nm or more, the roughening particles may be likely to break and the particle dropping may be likely to occur. Accordingly, the aspect ratio of roughening particles (the height of the roughening particles/the thickness of the roughening particles) is preferably 10.0 or less, more preferably 9.5 or less, still more preferably 9.0 or less, still more preferably 8.5 or less, still more preferably 8.0 or less, still more preferably 7.5 or less, still more preferably 7.0 or less, still more preferably 6.5 or less, still more preferably 6.0 or less, still more preferably 5.5 or less. The roughening particles can be more difficult to break and the particle dropping can be more difficult to occur by controlling the aspect ratio of the roughening particles to the above described range.

From the viewpoint of improving productivity, the height of the roughening particles is preferably 400 nm or less.

From the viewpoint of improving etching property, the height of the roughening particles is preferably 1200 nm or less.

The height of the roughening particles of the roughening treatment layer, and/or the thickness of the roughening particles of the roughening treatment layer of the surface-treated copper foil according to one or more embodiments of the present application, can be controlled by the current density, and/or the plating time, and/or the temperature of the plating solution at the time of plating. By increasing the current density, it is possible to increase the height of the roughening particles and/or to increase the thickness of the roughening particles. By lowering the current density, it is possible to reduce the height of the roughening particles and/or to reduce the thickness of the roughening particles. By increasing the plating time, it is possible to increase the height of the roughening particles and/or to increase the thickness of the roughening particles. By reducing the plating time, it is possible to reduce the height of the roughening particles and/or to reduce the thickness of the roughening particles. By lowering the temperature of the plating solution, it is possible to increase the height of the roughening particles and/or to increase the thickness of the roughening particles. By increasing the temperature of the plating solution, it is possible to reduce the height of the roughening particles and/or to reduce the thickness of the roughening particles. By increasing the copper concentration of the plating solution, it is possible to increase the thickness of the roughening particles. By lowering the copper concentration of the plating solution, it is possible to reduce the thickness of the roughening particles.

As described above, by increasing the height of the roughening particles and/or by reducing the thickness of the roughening particles, it is possible to increase the aspect ratio of the roughening particles. As described above, by reducing the height of the roughening particles and/or by increasing the thickness of the roughening particles, it is possible to reduce the aspect ratio of the roughening particles.

In the surface treated copper foil according to one or more embodiments of the present application, a color difference $\Delta E^*ab$ according to JIS Z 8730 of the surface of the side of the roughening treatment layer, which is measured when the object color of a white board (when the light source is D65 and the viewing angle is 10°, the tristimulus values of the $X_{10}Y_{10}Z_{10}$ colorimetric system (JIS Z 8701 1999) of the white board are $X_{10}$=80.7, $Y_{10}$=85.6, $Z_{10}$=91.5, and in the $L^*a^*b^*$ colorimetric system, the object color of the white board is $L^*$=94.14, $a^*$=−0.90, $b^*$=0.24) is used as a reference color, is preferably controlled to be 65 or less. With such a configuration, the frequency of presence of laminate of coarse roughening particles, which may cause the color difference $\Delta E^*ab$ to rise, can be small, and particle dropping can be favorably controlled. In the surface treated copper foil according to one or more embodiments of the present application, the color difference $\Delta E^*ab$ according to JIS Z 8730 of the surface of the side of the roughening treatment layer is preferably 62 or less, more preferably 60 or less, still more preferably 57 or less, still more preferably 50.0 or less.

Further, when the lower limit value of the color difference $\Delta E^*ab$ is controlled to 42 or more, for example, when a circuit is formed on a surface of a copper foil in the manufacture of a printed wiring board, the contrast between the copper foil and the circuit becomes clear, and as a result, the visibility of the circuit becomes favorable, and it may be possible to accurately position the circuit. Further, in order to raise the integrated circuit density of the printed wiring board, a method is generally used in which a laser hole is formed and an inner layer and an outer layer are connected through the hole. At this time, when the color difference $\Delta E^*ab$ of the surface of the side of the roughening treatment layer is controlled to 42 or more, since it is necessary to confirm the position of the copper foil circuit on a white stage through a PI (polyimide), the positioning accuracy may be improved at the time of positioning when stacking multilayer FPC using CCD camera. Also, because copper has an extremely low absorption rate of laser light in the far-infrared to infrared wavelength range such as a carbon dioxide gas laser, when $\Delta E^*ab$ is 42 or more, it may also lead to improvement of the absorption rate. The abovementioned color difference $\Delta E^*ab$ is preferably 45 or more, more preferably 47 or more, more preferably 49 or more, more preferably 50 or more, more preferably 51 or more, more preferably 52 or more. In addition, there are cases in which the adhesion of the surface of the copper foil to an insulating resin can be increased. Therefore, the abovementioned color difference $\Delta E^*ab$ is preferably 49.1 or more.

In the present application, when various surface treatment layer(s), such as a heat-resistant layer, a rust preventive layer, a chromate treatment layer or a silane coupling treatment layer is/are provided on the surface of the roughening treatment layer, "the surface of the side of the roughening treatment layer" refers to the surface of the surface treatment layer(s), or in other words, the outermost surface of the surface treated copper foil.

For example, when various surface treatment layer(s) such as a heat-resistant layer, a rust preventive layer, a chromate treatment layer or a silane coupling treatment layer is/are provided on the surface of the roughening treatment layer, "the color difference $\Delta E^*ab$ according to JIS Z 8730 of the surface of the side of the roughening treatment layer" refers to the color difference $\Delta E^*ab$ according to JIS Z 8730 of the surface of the surface treatment layer(s) (the outermost surface). According to the present application, the color difference $\Delta E^*ab$ according to JIS Z 8730 of the surface of the side of the roughening treatment layer of the surface treated copper foil is also preferably 52 or more, and more preferably 54 or more.

Here, the abovementioned color difference $\Delta E^*ab$ is expressed by the following equation. The color differences $\Delta L$, $\Delta a$ and $\Delta b$ in the following formular are measured with a color difference meter respectively, and the color difference $\Delta L$, $\Delta a$ and $\Delta b$ are general indicators shown with $L^*a^*b^*$ colorimetric system based on JIS Z 8730 (2009), taking into account black/white/red/green/yellow/blue. $\Delta L$ is expressed as black and white, $\Delta a$ is expressed as red and green, and $\Delta b$ is expressed as yellow and blue. The color difference ($\Delta L$, $\Delta a$, $\Delta b$) can be measured by a color difference meter MiniScan XE Plus manufactured by Hunter Associates Laboratory, Inc. Besides, the color differences $\Delta L$, $\Delta a$, and $\Delta b$ are respectively color differences based on JIS Z 8730 (2009) when the object color of the abovementioned white board is used as a reference color, and $\Delta L$ is a difference of the CIE lightness $L^*$ of two object colors based on the $L^*a^*b^*$ colorimetric system defined in JIS Z 8730 (2009), and $\Delta a$ and $\Delta b$ are the differences of the color coordinates $a^*$ or $b^*$ of the two object colors based on the $L^*a^*b^*$ colorimetric system defined in JIS Z 8729 (2004).

$$\Delta E^*ab = \sqrt{\Delta L^2 + \Delta a^2 + \Delta b^2}$$

The abovementioned color difference can be controlled by the formation condition of the roughening treatment layer. Specifically, at the time of forming the roughening treatment layer, by using an electrolytic solution comprising plural elements, for example, one or more elements selected from the group consisting of copper, nickel, cobalt, tungsten, molybdenum, phosphorus, zinc, tin, chromium, and iron, and by controlling the current density, the processing time, and the temperature of the processing liquid, the abovementioned color difference can be controlled. In order to easily control the height of the roughening particles and/or the color difference, the roughening treatment layer is preferably an alloy containing copper. By increasing the current density, the color difference can be increased. By lowering the current density, the color difference can be reduced. By increasing the plating time, the color difference can be increased. By shortening the plating time, the color difference can be reduced. By lowering the temperature of the plating solution, the color difference can be increased. By increasing the temperature of the plating solution, the color difference can be reduced.

Further, as metallic composition of the roughening treatment solution, by lowering a concentration of copper and by increasing a concentration of other metals, the color difference can be increased.

In the surface treated copper foil according to one or more embodiments of the present application, a glossiness of the TD of the surface of the side of the roughening treatment layer of the surface treated copper foil is controlled to 70% or less. If the glossiness of the TD of the surface of the side of the roughening treatment layer of the surface treated copper foil exceeds 70%, there is a possibility that wrinkles and stripes may occur when bonding the surface treated copper foil and a resin. the glossiness of the TD of the surface of the side of the roughening treatment layer of the surface treated copper foil is preferably 69% or less, more preferably 68% or less, more preferably 67% or less, more preferably 66% or less, still more preferably 65% or less, still more preferably 60% or less, still more preferably 55% or less, still more preferably 50% or less, still more preferably 45% or less, still more preferably 25% or less, still more preferably 20% or less, still more preferably 10% or less, and still more preferably 5% or less. The lower limit of the glossiness of the TD of the surface of the side of the roughening treatment layer of the surface treated copper foil is not particularly limited, but is typically, for example, 0.01% or more, for example, 0.1% or more, for example, 0.3% or more, and for example, 0.5% or more. In addition, there are cases in which the particle dropping can be more favorably suppressed. Therefore, the glossiness of the TD of the surface of the side of the roughening treatment layer of the surface treated copper foil is preferably 21% or more.

The glossiness of the TD of the surface of the side of the roughening treatment layer of the surface treated copper foil can be controlled by adjusting the glossiness of the TD of the copper foil or the carrier before the surface treatment and/or the current density at the time of plating on the copper foil, and/or the plating time and/or the temperature of the plating solution. By lowering the glossiness of the TD of the copper foil or the carrier before the surface treatment, it is possible to lower the glossiness of the TD of the surface of the side of the roughening treatment layer of the surface treated copper foil. By increasing the glossiness of the TD of the copper foil or the carrier before the surface treatment, it is possible to increase the glossiness of the TD of the surface of the side of the roughening treatment layer of the surface treated copper foil. By increasing the current density, it is possible to lower the glossiness of the TD of the surface of the side of the roughening treatment layer of the surface treated copper foil. By lowering the current density, it is possible to increase the glossiness of the TD of the surface of the side of the roughening treatment layer of the surface treated copper foil. By increasing the plating time, it is possible to lower the glossiness of the TD of the surface of the side of the roughening treatment layer of the surface treated copper foil. By shortening the plating time, it is possible to increase the glossiness of the TD of the surface of the side of the roughening treatment layer of the surface treated copper foil. By lowering the temperature of the plating solution, it is possible to lower the glossiness of the TD of the surface of the side of the roughening treatment layer of the surface treated copper foil. By increasing the temperature of the plating solution, it is possible to increase the glossiness of the TD of the surface of the side of the roughening treatment layer of the surface treated copper foil.

In the present application, when various surface treatment layer(s), such as a heat-resistant layer, a rust preventive layer, a chromate treatment layer or a silane coupling treatment layer is/are provided on the surface of the roughening treatment layer, "the glossiness of the TD of the surface of the side of the roughening treatment layer" refers to the glossiness of the TD of the surface of the surface treatment layer(s), or in other words, the outermost surface of the surface treated copper foil.

In the surface treated copper foil according to one or more embodiments of the present application, a thickness of the roughening particles of the roughening treatment layer is preferably 5 nm or more. If the thickness of the roughening particles of the roughening treatment layer is 5 nm or more, the peel strength at the time of peeling off a resin from the surface treated copper foil after laminating the surface treated copper foil to the resin from the roughening treatment layer side, can be made favorable. From the viewpoint of further improving the peel strength as described above, the thickness of the roughening particles of the roughening treatment layer is more preferably 7 nm or more, more preferably 10 nm or more, more preferably 15 nm or more, more preferably 20 nm or more, more preferably 21 nm or more, more preferably 25 nm or more, more preferably 27 nm or more, more preferably 30 nm or more, more preferably 35 nm or more, more preferably 40 nm or more.

In the surface treated copper foil according to one or more embodiments of the present application, a thickness of the roughening particles of the roughening treatment layer is preferably 500 nm or less. If the thickness of the roughening particles of the roughening treatment layer is 500 nm or less, after laminating the surface treated copper foil to the resin from the roughening treatment layer side, when forming a circuit by removing the unnecessary portion of the surface treated copper foil via etching, there may be an effect that residues of the surface treated copper foil are less likely to remain on the surface of the resin after the surface treated copper foil is removed. From the viewpoint that the residues of the above-mentioned surface-treated copper foil are less likely to remain, the thickness of the roughening particles in the roughening treatment layer is more preferably 480 nm or less, more preferably 460 nm or less, more preferably 440 nm or less, more preferably 420 nm or less, more preferably 400 nm or less, more preferably 380 nm or less, more preferably 360 nm or less, more preferably 340 nm or less, more preferably 320 nm or less, more preferably 300 nm or less, more preferably 280 nm or less, more preferably 260 nm or less, more preferably 250 nm or less, still more preferably 240 nm or less, still more preferably 220 nm or less. Further, from the viewpoint of further improving the productivity as described later, the thickness of the roughening particles of the roughening treatment layer is preferably 79 nm or less.

The roughening treatment layer in the surface treated copper foil according to the present application can be produced under the following conditions.

(Plating Conditions for the Roughing Treatment Layer)

An example of the plating conditions for forming the roughening treatment layer is as follows.

Liquid composition: Copper 10 to 25 g/L, cobalt 7 to 10 g/L, nickel 7 to 10 g/L
pH: 2.0 to 3.0
Liquid temperature: 40 to 60° C.
Current density: 10 to 60 A/dm$^2$
Plating time: 0.2 to 1.6 seconds
Coulomb quantity: 0.6 to 100 As/dm$^2$ When the current density is high, it is necessary to maintain the temperature of the plating solution in the above described range and/or to shorten the plating time. When current density is low, it is necessary to maintain the temperature of the plating solution in a high side of the above described range and/or to increase the plating time to some extent.

Any one of the following (A) to (E) may be used as a liquid composition for forming the roughening treatment layer. For other conditions, the above-described conditions may be used.

(A) copper 10 to 20 g/L, nickel 3 to 10 g/L, phosphorus 0.1 to 2.0 g/L
(B) copper 3 to 10 g/L, cobalt 10 to 20 g/L, nickel 10 to 20 g/L
(C) copper 3 to 10 g/L, cobalt 10 to 20 g/L, nickel 10 to 20 g/L, tungsten 0.001 to 5 g/L
(D) copper 5 to 15 g/L, nickel 5 to 15 g/L, molybdenum 0.1 to 10 g/L
(E) copper 5 to 15 g/L, nickel 5 to 15 g/L, molybdenum 0.1 to 10 g/L, phosphorus 0.1 to 2.0 g/L The liquid for forming the abovementioned roughening treatment layer may contain one or more elements selected from nickel, cobalt, tungsten, molybdenum, phosphorus, zinc, tin, chromium and iron.

Further, as described above, the roughening treatment layer may be formed on one surface of the copper foil to form the surface treated copper foil according to the present application, or may be formed on both surfaces of the copper foil.

<Copper Foil with Carrier>

The copper foil with a carrier according to another embodiment of the present application has an intermediate layer and an ultrathin copper layer in this order on one side or both sides of a carrier. Further, the ultra-thin copper layer is the surface treated copper foil according to one embodiment of the present application described above.

<Carrier>

The carrier that can be used in the present application is typically a metal foil or a resin film, for example, a copper foil, a copper alloy foil, a nickel foil, a nickel alloy foil, an iron foil, an iron alloy foil, a stainless foil, an aluminum foil, an aluminum alloy foil, an insulating resin film, a polyimide film, an LCP (liquid crystal polymer) film, a fluororesin film, a PET (polyethylene terephthalate) film, a PP (polypropylene) film, a polyamide film, and a polyamideimide film can be provided.

The carrier that can be used in the present application is typically provided in the form of a rolled copper foil or an electrolytic copper foil. Generally, an electrolytic copper foil is manufactured by electrodepositing copper on a titanium drum or a stainless drum from in copper sulfate plating bath, and a rolled copper foil is manufactured by repeating plastic working with a rolling roll and heat treatment. Besides, as a material of the copper foil, other than high purity copper such as tough pitch copper (JIS H 3100 alloy number C1100) or oxygen free copper (JIS H 3100 alloy number C1020 or JIS H 3510 alloy number C1011), for example, copper containing Sn, copper containing Ag, copper alloy to which Cr, Zr, Mg or the like is added, or Corson type copper alloy to which Ni, Si and the like are added, also can be used. Incidentally, in this specification, when the term "copper foil" is used alone, it also includes a copper alloy foil.

The thickness of the carrier that can be used in the present application is also not particularly limited, but it may be appropriately adjusted to a thickness suitable for fulfilling its role as a carrier, for example, it may be 5 μm or more. Meanwhile, if it is too thick, the production cost will be high, so it is generally preferable to set the thickness of the carrier to 35 μm or less. Accordingly, the thickness of the carrier is typically 8 to 70 μm, more typically 12 to 70 μm, more typically 18 to 35 μm. From the viewpoint of reducing raw material cost, it is preferable that the thickness of the carrier be small. Therefore, the thickness of the carrier is typically 5 μm or more and 35 μm or less, preferably 5 μm or more and 18 μm or less, preferably 5 μm or more and 12 μm or less, preferably 5 μm or more and 11 μm or less, preferably 5 μm or more and 10 μm or less. Besides, when the thickness of the carrier is too small, fold wrinkles are likely to occur at the time of passing the carrier. In order to prevent the occurrence of fold wrinkles, it is effective to, for example, smooth the conveyance roll of the manufacturing apparatus for the copper foil with carrier, or shorten the distance between the conveyance roll and the next conveyance roll. Further, in the cases in which the carrier foil with carrier is used in an embedding process, which is one of the methods for manufacturing a printed wiring board, it is necessary that the carrier has high rigidity. Therefore, when used in the embedding method, the thickness of the carrier is preferably 18 μm or more and 300 μm or less, more preferably 25 μm or more and 150 μm or less, more preferably 35 μm or more and 100 μm or less, and sill more preferably 35 μm or more and 70 μm or less.

Also, a roughening treatment layer may be provided on the surface of the side opposite to the surface of the side on which the ultra-thin copper layer is provided on the carrier. The roughening treatment layer may be provided using a known method or may be provided by a roughening treatment to be described later. Providing a roughening treatment layer on the surface of the side opposite to the surface of the side on which the ultra-thin copper layer is provided on the carrier means that, when the carrier is laminated on a support such as a resin substrate from the surface of the side having the roughening treatment layer, there is an advantage that it is difficult for the carrier and the resin substrate to separate from each other.

An example of manufacturing conditions in the case where an electrolytic copper foil is used as a carrier is described below.

<Composition of Electrolytic Solution>
Copper: 90 to 110 g/L
Sulfuric acid: 90 to 110 g/L
Chlorine: 50 to 100 ppm
Leveling agent 1 (bis(3-sulfopropyl)disulfide): 10 to 30 ppm
Leveling agent 2 (amine compound): 10 to 30 ppm For the amine compound, an amine compound having the following chemical formula can be used.

Besides, the remainder of the treatment liquid used for electrolysis, surface treatment, plating or the like used according to the present application is water unless otherwise specified.

[Chemical formula 1]

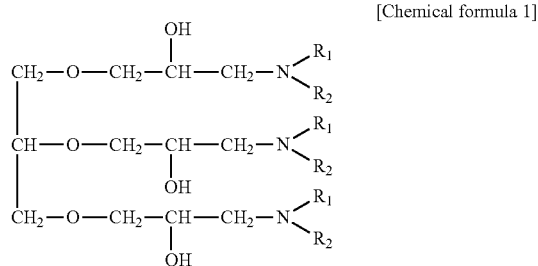

(in the chemical formula, $R_1$ and $R_2$ are respectively a group selected from the group consisting of a hydroxyalkyl group, an ether group, an aryl group, an aromatic substituted alkyl group, an unsaturated hydrocarbon group, and an alkyl group.)

<Production Conditions>
Current density: 70 to 100 A/dm$^2$
Electrolyte temperature: 50 to 60° C.
Linear speed of electrolyte: 3 to 5 m/sec
Electrolysis time: 0.5 to 10 minutes <Intermediate Layer>

An intermediate layer is provided on the carrier. Besides, another layer (or layers) may be provided between the carrier and the intermediate layer. The intermediate layer used in the present application is not particularly limited as long as the intermediate layer has a constitution such that the ultra-thin copper layer is hard to peel from the carrier before the step of laminating the copper foil with carrier on an insulating substrate, and on the other hand, after the step of laminating on the insulating substrate, the ultra-thin copper layer is allowed to be peeled from the carrier. For example, the intermediate layer of the copper foil with carrier according to one or more embodiments of the present application may include one or two or more selected from the group consisting of Cr, Ni, Co, Fe, Mo, Ti, W, P, Cu, Al, Zn, one alloy or more alloys containing one or two or more selected from the group consisting of Cr, Ni, Co, Fe, Mo, Ti, W, P, Cu, Al, Zn, one hydrate or more hydrates containing one or two or more selected from the group consisting of Cr, Ni, Co, Fe, Mo, Ti, W, P, Cu, Al, Zn, one oxide or more oxides containing one or two or more selected from the group consisting of these and one organic substance or more organic substances. In addition, the intermediate layer may be composed of two or more layers.

Further, for example, the intermediate layer can be constituted by forming, from the carrier side, a single metal layer composed of one element selected from the element group consisting of Cr, Ni, Co, Fe, Mo, Ti, W, P, Cu, Al and Zn, or by forming an alloy layer composed of one or two or more elements selected from the element group consisting of Cr, Ni, Co, Fe, Mo, Ti, W, P, Cu, Al and Zn, and then forming, on the top of the single metal layer or the alloy layer, a layer composed of one hydrate or more hydrates or one oxide or more oxides of one or two or more elements selected from the element group consisting of Cr, Ni, Co, Fe, Mo, Ti, W, P, Cu, Al and Zn, or a layer composed of one organic substance or more organic substances, or a single metal layer composed of one element selected from the element group consisting of Cr, Ni, Co, Fe, Mo, Ti, W, P, Cu, Al and Zn, or an alloy layer composed of one or two or more elements selected from the element group consisting of Cr, Ni, Co, Fe, Mo, Ti, W, P, Cu, Al and Zn.

When the intermediate layer is provided only on one side, it is preferable to provide a rust preventive layer such as a Ni plating layer on the opposite side of the carrier. When the intermediate layer is provided by chromate treatment, zinc chromate treatment or plating treatment, it is considered that some of the attached metal such as chromium and zinc may be in the form of hydrates or oxides.

In addition, for example, the intermediate layer can be constituted by laminating, on the carrier, nickel, a nickel-phosphorus alloy (or a nickel-cobalt alloy), and chromium in this order. The adhesion between nickel and copper is higher than the adhesion between chromium and copper, and hence, when peeling off the ultra-thin copper layer, peeling occurs between the ultra-thin copper layer and chromium. For the nickel in the intermediate layer, the barrier effect of preventing the diffusion of the copper component from the carrier to the ultra-thin copper layer is expected. The deposition amount of nickel in the intermediate layer is preferably 100 µg/dm² or more and 40000 µg/dm² or less, more preferably 100 µg/dm² or more and 4000 µg/dm² or less, more preferably 100 µg/dm² or more and 2500 µg/dm² or less, and more preferably 100 µg/dm² or more and 1000 µg/dm² or less; the deposition amount of chromium in the intermediate layer is preferably 5 µg/dm² or more and 100 µg/dm² or less.

<Ultra-Thin Copper Layer>

An Ultra-thin copper layer is provided on the intermediate layer. Besides, another layer (or layers) may be provided between the intermediate layer and the ultra-thin copper layer. The ultra-thin copper layer can be formed by electroplating using an electrolytic bath such as copper sulfate, copper pyrophosphate, copper sulfamate, copper cyanide, etc. A copper sulfate bath, which is used in ordinary electrolytic copper foil and is capable of forming a copper foil at high current density, is preferred. The thickness of the ultra-thin copper layer is not particularly limited, but is generally thinner than the carrier, for example, 12 µm or less. The thickness of the ultra-thin copper layer is typically 0.5 to 12 µm, more typically 1 to 5 µm, more typically 1.5 to 5 µm, still more typically 2 to 5 µm. Further, the ultra-thin copper layers may be provided on both sides of the carrier.

In this way, a copper foil with carrier, comprising a carrier, an intermediate layer laminated on the carrier, and an ultra-thin copper layer laminated on the intermediate layer, is manufactured. The method of using the carrier foil with carrier itself is well known to those skilled in the art. For example, the surface of the ultra-thin copper layer can be bonded to an insulating substrate and thermocompression bonded, the insulating substrate can be a paper base phenol resin, a paper base epoxy resin, a synthetic fiber cloth base epoxy resin, a glass cloth/paper composite base epoxy resin, a glass cloth/glass nonwoven fabric composite base epoxy resin, a glass cloth base epoxy resin, a polyester film, a polyimide film and the like. Then, by peeling off the carrier to form a copper clad laminate, and etching the ultra-thin copper layer adhered to the insulating substrate into a target conductor pattern, a printed wiring board can be finally manufactured.

The method of using the carrier foil with carrier itself is well known to those skilled in the art. For example, the surface of the ultra-thin copper layer can be bonded to an insulating substrate and thermocompression bonded, the insulating substrate can be a paper base phenol resin, a paper base epoxy resin, a synthetic fiber cloth base epoxy resin, a glass cloth/paper composite base epoxy resin, a glass cloth/ glass nonwoven fabric composite base epoxy resin, a glass cloth base epoxy resin, a polyester film, a polyimide film and the like. Then, by peeling off the carrier to form a copper clad laminate, and etching the ultra-thin copper layer adhered to the insulating substrate into a target conductor pattern, a printed wiring board can be finally manufactured.

<Other Surface Treatment>

After the roughening treatment, a heat resistant layer or an rust preventive layer may be formed using a simple substance of Ni, Co, Cu, Zn, or Ni alloy, Co alloy, Cu alloy, Zn alloy, or an alloy including one or more elements selected from the group consisting of Ni, Co, Cu, Zn, or the like, and the surface thereof may be subjected to a treatment such as a chromate treatment or a silane coupling treatment. That is, on the surface of the roughening treated layer, one or more layers selected from the group consisting of a heat resistant layer, a rust preventive layer, a chromate treatment layer and a silane coupling treatment layer, may be formed. Further, the heat resistant layer, the rust preventive layer, the chromate treatment layer and the silane coupling treatment layer may each have a plurality of layers (for example, two or more layers, three or more layers, etc.).

In this specification, the chromate treatment layer refers to a layer treated with a solution containing chromic anhydride, chromic acid, dichromic acid, chromate or dichromate. The chromate treatment layer may comprise element(s) such as Co, Fe, Ni, Mo, Zn, Ta, Cu, Al, P, W, Sn, As, Ti or the like (the form is not limited and can be metal, alloy, oxide, nitride, sulfide, etc.). Specific examples of the chromate treatment layer include a chromate treatment layer treated with an aqueous solution of chromic anhydride or potassium dichromate, a chromate treatment layer treated with a treatment liquid containing chromic anhydride or potassium dichromate and zinc, and the like.

As the heat resistant layer and the rust preventing layer, a known heat resistant layers and rust preventing layers can be used. For example, the heat resistant layer and/or the rust-preventing layer may be a layer including one or more elements selected from the group consisting of nickel, zinc, tin, cobalt, molybdenum, copper, tungsten, phosphorus, arsenic, chromium, vanadium, titanium, aluminum, gold, silver, platinum group elements, iron and tantalum; or a metal layer or an alloy layer composed of one or more elements selected from the group consisting of nickel, zinc, tin, cobalt, molybdenum, copper, tungsten, phosphorus, arsenic, chromium, vanadium, titanium, aluminum, gold, silver, platinum group elements, iron and tantalum. The heat resistant layer and/or the rust preventing layer may also include an oxide, a nitride and a silicide including the abovementioned element. The heat resistant layer and/or the rust preventing layer may also be a layer including a nickel-zinc alloy. The heat resistant layer and/or the rust preventing layer may also be a nickel-zinc alloy layer. The nickel-zinc alloy layer may be a layer containing 50 wt % to 99 wt % of nickel and 50 wt % to 1 wt % of zinc, zinc, except for inevitable impurities. The total deposition amount of zinc and nickel in the nickel-zinc alloy layer may be 5 to 1000 mg/m², preferably 10 to 500 mg/m², and preferably 20 to 100 mg/m². The ratio between the deposition amount of nickel and the deposition amount of zinc in the nickel-zinc alloy-containing layer or the nickel-zinc alloy layer (=deposition amount of nickel/deposition amount of zinc) is preferably 1.5 to 10. The deposition amount of nickel in the layer including a nickel-zinc alloy or the nickel-zinc alloy layer is preferably 0.5 mg/m² to 500 mg/m², and more preferably 1 mg/m² to 50 mg/m². In the case where the heat resistant layer and/or the rust preventing layer is a layer including a nickel-zinc alloy, when the inner wall portion of the through-holes, the via holes or the like is brought into contact with the desmear solution, the interface between the copper foil and the resin substrate is hardly corroded by the desmear solution, and the adhesion between the copper foil and the resin substrate is improved.

The silane coupling treatment layer may be formed using a known silane coupling agent or using a silane coupling agent such as an epoxy type silane, an amino type silane, a methacryloxy type silane, a mercapto type silane, a vinyl type silane, an imidazole type silane, a triazine type silane, or the like. Further, two or more of such silane coupling agents may be mixed and used. Among these, a silane coupling treatment layer formed using an amino type silane coupling agent or an epoxy type silane coupling agent is preferable.

Further, on the surfaces of the copper foil, the ultra-thin copper layer, the roughening treatment layer, the heat resistant layer, the rust preventive layer, the silane coupling treatment layer or the chromate treated layer, surface treatments known in the art can be performed.

<Resin Layer>

The surface treated copper foil may be a surface treated copper foil with resin layer, which is provided with a resin layer on the surface of the side of the roughening treatment layer. The resin layer may be an adhesive or an insulating resin layer in a semi-cured state (B stage) for adhesion. The semi-cured state (B stage) includes the condition wherein, there is no sticky feeling even when it is touched by a finger on its surface, and the insulating resin layer can be stacked and stored, and furthermore a curing reaction occurs when it is subjected to a heat treatment.

The resin layer may contain a thermosetting resin or may be a thermoplastic resin. The resin layer may include a thermoplastic resin. The type of the abovementioned resin is not particularly limited; For example, a resin containing one or more selected from the group consisting of the following resin can be favorably used: epoxy resin, polyimide resin, multifunctional cyanate ester compound, maleimide compound, polymaleimide compound, maleimide resin, aromatic maleimide resin, polyvinyl acetal resin, urethane resin, polyethersulfone, polyethersulfone resin, aromatic polyamide resin, aromatic polyamide resin polymer, rubber resin, polyamine, aromatic polyamine, polyamide imide resin, rubber modified epoxy resin, phenoxy resin, carboxyl group modified acrylonitrile-butadiene resin, polyphenylene oxide, bismaleimide triazine resin, thermosetting polyphenylene oxide resin, cyanate ester type resin, anhydride of carboxylic acid, anhydride of polyvalent carboxylic acid, linear polymer having crosslinkable functional group, polyphenylene ether resin, 2,2-bis(4-cyanatophenyl)propane, phosphorus-containing phenol compound, manganese naphthenate, 2,2-bis(4-glycidyloxyphenyl)propane, polyphenylene ether-cyanate resin, siloxane-modified polyamideimide resin, cyanoester resin, phosphazene type resin, rubber modified polyamide imide resin, isoprene, hydrogenated polybutadiene, polyvinyl butyral, phenoxy, high molecular weight epoxy, aromatic polyamide, fluorine resin, bisphenol, block copolymerized polyimide resin and cyanoester resin.

Further, the epoxy resin has two or more epoxy groups in the molecule and can be used without any particular problem as long as it can be used for electric/electronic materials. The epoxy resin is preferably an epoxy resin obtained by epoxidation using a compound having two or more glycidyl groups in the molecule. One or two or more selected from the group consisting of the following can be favorably used: bisphenol A type epoxy resin, bisphenol F type epoxy resin, bisphenol S type epoxy resin, bisphenol AD type epoxy resin, novolak type epoxy resin, cresol novolak type epoxy resin, alicyclic epoxy resin, brominated epoxy resin, phenol novolak type epoxy resin, naphthalene type epoxy resin, brominated bisphenol A type epoxy resin, orthocresol novolac type epoxy resin, rubber modified bisphenol A type epoxy resin, glycidyl amine type epoxy resin, triglycidyl isocyanurate, glycidyl amine compounds such as N,N-diglycidylaniline, glycidyl ester compounds such as tetrahydrophthalic acid diglycidyl ester, phosphorus-containing epoxy resin, biphenyl type epoxy resin, biphenyl Novolak type epoxy resin, trishydroxyphenylmethane type epoxy resin, tetraphenyl ethane epoxy resin. Also, a hydrogenated product or a halogenated product of the abovementioned epoxy resin can be used.

As the phosphorus-containing epoxy resins, an known epoxy resin containing phosphorus known can be used. Further, the phosphorus-containing epoxy resin is, for example, preferably an epoxy resin obtained as a derivative from a 9,10-dihydro-9-oxa-10-phosphaphenanthrene-10-oxide having two or more epoxy groups in the molecule.

The resin layer may contain a resin known in the art, a resin curing agent, a compound, a curing accelerator, a dielectric substance (any dielectric substance may be used such as a dielectric substance containing an inorganic compound and/or an organic compound and a dielectric substance containing a metal oxide), a reaction catalyst, a crosslinking agent, a polymer, a prepreg and a skeletal material. The resin layer may be formed by a method for forming a resin layer and/or a forming apparatus known in the art.

Resin solutions are prepared by dissolving the abovementioned resins in the solvents such as MEK (methyl ethyl ketone), toluene or the like; these resin solutions are applied to the ultra-thin copper layer, or the heat resistant layer, the rust preventing layer, the chromate treatment layer, or the silane coupling treatment layer by, for example, a roll coater method, successively heat-dried, if necessary, to remove the solvent to form a B-stage state. For the drying, for example, a hot air drying furnace may be used, and the drying temperature may be 100 to 250° C., and preferably 130 to 200° C.

The copper foil with carrier provided with the resin layer (the copper foil with resin and carrier) is used in a mode in which the resin layer is superposed on a substrate, then the whole is thermally compression bonded to thermally cure the resin layer, successively the carrier is peeled to expose the ultra-thin copper layer (naturally, the exposed face is the surface on the intermediate layer side of the ultra-thin copper layer), and a predetermined wiring pattern is formed on the exposed ultra-thin copper layer.

When the copper foil with resin and carrier is used, it is possible to reduce the number of sheets of prepreg material used during the production of a multilayer printed wiring board. Moreover, it is possible to produce a copper clad laminate when the thickness of the resin layer is allowed to be a thickness capable of ensuring interlayer insulation, or even when no prepreg material is used at all. In this case, it is also possible to further improve the smoothness of the surface of the substrate by undercoating an insulating resin on the surface of the substrate.

Besides, when no prepreg material is used, the material cost for the prepreg material can be saved, the laminating step is made simple, thus, it is economically advantageous, the thickness of the produced multilayer printed wiring board is made thinner by the thickness of the prepreg material, and there is an advantage that an ultra-thin multilayer printed wiring board having a thickness of one layer of 100 μm or less can be produced.

The thickness of the resin layer is preferably 0.1 to 80 μm. When the thickness of the resin layer is thinner than 0.1 μm, the adhesive strength decreases, and when the copper foil with resin and carrier is laminated on a substrate provided with an inner layer material without interposing a prepreg material, it may become difficult to secure interlayer insulation between the inner layer material and the circuit.

On the other hand, if the thickness of the resin layer is larger than 80 μm, it becomes difficult to form a resin layer having a target thickness by one step of application, which is economically disadvantageous because of extra material cost and man-power. Further, since the formed resin layer is inferior in flexibility, cracks and the like are likely to occur at the time of handling, and excessive resin flowing occurs at the time of thermocompression bonding with the inner layer material, resulting in difficulty in smooth lamination.

Moreover, as another product form of the copper foil with resin and carrier, it is also possible to form a resin layer on the ultra-thin copper layer, or on the heat resistant layer, the rust preventive layer, the chromate treatment layer, or the silane coupling treatment layer, and then converting the resin layer into a semi-cured state, and then peeling off the carrier to produce a copper foil with layer in the absence of a carrier.

By mounting electronic components on the printed wiring board, a printed circuit board is completed. In the present application, "printed wiring board" is defined as including such a printed wiring board on which electronic components and the like are mounted, and also a printed circuit board, and a printed substrate.

Further, an electronic device may be manufactured using the printed wiring board, and an electronic device may be manufactured using the printed circuit board on which the electronic components are mounted, and an electronic device may be manufactured using the printed substrate on which the electronic components are mounted. Several examples of manufacturing processes of a printed wiring board using the copper foil with carrier according to the present application are shown below. Further, a printed wiring board can also be similarly manufactured by using the surface treated copper foil according to the present application as the ultra-thin copper layer of the copper foil with carrier.

One embodiment of the method for manufacturing a printed wiring board according to the present application comprises a step of preparing the copper foil with carrier according to the present application, and an insulating substrate; a step of laminating the copper foil with carrier and the insulating substrate; after laminating the copper foil with carrier and the insulating substrate so that the side of the ultra-thin copper layer faces the insulating substrate, a step of peeling off the carrier of the copper foil with carrier to form a copper clad laminate; and after that, a step of forming a circuit by a semi-additive method, a subtractive method, a partly additive method or a modified semi-additive method using the copper clad laminate. The resin substrate can be a resin substrate incorporating an inner layer circuit.

In the present application, the semi-additive method refers to a method in which a thin electroless plating is applied on an insulating substrate or a copper foil seed layer, and after the formation of a pattern, a conductor pattern is formed by electroplating and etching.

Therefore, one embodiment using the semi-additive method, of the method for manufacturing a printed wiring board according to the present application comprises a step of preparing the copper foil with carrier according to the present application, and an insulating substrate;

a step of laminating the copper foil with carrier and the insulating substrate;

after laminating the copper foil with carrier and the insulating substrate, a step of peeling off the carrier of the copper foil with carrier;

a step of completely removing the ultra-thin copper layer, which is exposed by peeling off the carrier, by etching using a corrosive solution such as and acid or by etching with plasma or the like;

a step of providing through-holes or/and blind vias in the resin, which is exposed by removing the ultra-thin copper layer by etching;

a step of performing desmear treatment on the region including the through-holes or/and the blind vias;

a step of providing an electroless plating layer in the region including the resin and the through-holes or/and the blind vias;

a step of providing a plating resist on the electroless plating layer;

a step of exposing the plating resist, and then removing the plating resist in a region where a circuit is to be formed;

a step of providing an electrolytic plating layer on the region where the plating resist is removed and the circuit is to be formed;

a step of removing the plating resist; and a step of removing the electroless plating layer in the region other than the region where the circuit is to be formed by flash etching or the like.

Another embodiment using the semi-additive method, of the method for manufacturing a printed wiring board according to the present application comprises a step of preparing the copper foil with carrier according to the present application, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating resin substrate;

a step of performing desmear treatment on the region including the through-holes or/and the blind vias;

a step of completely removing the ultra-thin copper layer, which is exposed by peeling off the carrier, by etching using a corrosive solution such as and acid or by etching with plasma or the like;

a step of providing an electroless plating layer in the region including the resin which is exposed by removing the ultra-thin copper layer by etching or the like, and the through-holes or/and the blind vias;

a step of providing a plating resist on the electroless plating layer;

a step of exposing the plating resist, and then removing the plating resist in a region where a circuit is to be formed;

a step of providing an electrolytic plating layer on the region where the plating resist is removed and the circuit is to be formed;

a step of removing the plating resist; and a step of removing the electroless plating layer in the region other than the region where the circuit is to be formed by flash etching or the like.

Another embodiment using the semi-additive method, of the method for manufacturing a printed wiring board according to the present application comprises a step of preparing the copper foil with carrier according to the present application, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating resin substrate;

a step of completely removing the ultra-thin copper layer, which is exposed by peeling off the carrier, by etching using a corrosive solution such as and acid or by etching with plasma or the like;

a step of performing desmear treatment on the region including the through-holes or/and the blind vias;

a step of providing an electroless plating layer in the region including the resin which is exposed by removing the ultra-thin copper layer by etching or the like, and the through-holes or/and the blind vias;

a step of providing a plating resist on the electroless plating layer;

a step of exposing the plating resist, and then removing the plating resist in a region where a circuit is to be formed;

a step of providing an electrolytic plating layer on the region where the plating resist is removed and the circuit is to be formed;

a step of removing the plating resist; and a step of removing the electroless plating layer in the region other than the region where the circuit is to be formed by flash etching or the like.

Another embodiment using the semi-additive method, of the method for manufacturing a printed wiring board according to the present application comprises a step of preparing the copper foil with carrier according to the present application, and an insulating substrate;

a step of laminating the copper foil with carrier and the insulating substrate;

after laminating the copper foil with carrier and the insulating substrate, a step of peeling off the carrier of the copper foil with carrier;

a step of completely removing the ultra-thin copper layer, which is exposed by peeling off the carrier, by etching using a corrosive solution such as and acid or by etching with plasma or the like;

a step of providing an electroless plating layer in the region including the resin which is exposed by removing the ultra-thin copper layer by etching or the like, and the through-holes or/and the blind vias;

a step of providing a plating resist on the electroless plating layer;

a step of exposing the plating resist, and then removing the plating resist in a region where a circuit is to be formed;

a step of providing an electrolytic plating layer on the region where the plating resist is removed and the circuit is to be formed;

a step of removing the plating resist; and a step of removing the electroless plating layer in the region other than the region where the circuit is to be formed by flash etching or the like.

In the present application, the modified semi-additive method refers to a method in which a metal foil is laminated on an insulating layer; the non-circuit-formation portion is protected with a plating resist, and copper is plated up at the circuit forming portion by electrolytic plating; and then, the resist is removed and the metal foil on the portion other than the circuit-formation portion is removed by (flash) etching to form a circuit on the insulating layer.

Therefore, one embodiment using the modified semi-additive method, of the method for manufacturing a printed wiring board according to the present application comprises a step of preparing the copper foil with carrier according to the present application, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating substrate;

a step of performing desmear treatment on the region including the through-holes or/and the blind vias;

a step of providing an electroless plating layer in the region including the through-holes or/and the blind vias;

a step of providing a plating resist on the surface of the ultra-thin copper layer which is exposed by peeling off the carrier;

after providing the plating resist, a step of forming a circuit by electrolytic plating;

a step of removing the plating resist; and a step of removing, by flash etching, the ultra-thin copper layer which is exposed by removing the plating resist.

Another embodiment using the modified semi-additive method, of the method for manufacturing a printed wiring board according to the present application comprises a step of preparing the copper foil with carrier according to the present application, and an insulating substrate;

a step of laminating the copper foil with carrier and the insulating substrate;

after laminating the copper foil with carrier and the insulating substrate, a step of peeling off the carrier of the copper foil with carrier;

a step of providing a plating resist on the surface of the ultra-thin copper layer which is exposed by peeling off the carrier;

a step of exposing the plating resist, and then removing the plating resist in a region where a circuit is to be formed;

a step of providing an electrolytic plating layer on the region where the plating resist is removed and the circuit is to be formed;

a step of removing the plating resist; and a step of removing the electroless plating layer in the region other than the region where the circuit is to be formed by flash etching or the like.

In the present application, the partly additive method refers to a method in which catalyst nuclei are imparted on a substrate including a conductor layer, or, if necessary, on a substrate including pierced holes for through-holes or via holes, and the substrate is etched to form a conductor circuit; and, if necessary, after a solder resist or a plating resist is provided, plating up is applied to the through-holes, via holes or the like on the conductor circuit by electroless plating treatment to manufacture a printed wiring board.

Therefore, one embodiment using the partly additive method, of the method for manufacturing a printed wiring board according to the present application comprises a step of preparing the copper foil with carrier according to the present application, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating substrate;

a step of performing desmear treatment on the region including the through-holes or/and the blind vias;

a step of imparting catalyst nuclei to the region including the through-holes or/and the blind vias;

a step of providing an etching resist on the surface of the ultra-thin copper layer which is exposed by peeling the carrier;

a step of forming a circuit pattern by exposing the etching resist;

a step of forming a circuit by removing the ultra-thin copper layer and the catalyst nuclei by a method such as etching with a corrosive solution such as an acid or by etching with plasma;

a step of removing the etching resist;

a step of providing a solder resist or a plating resist on the surface of the insulating resin substrate exposed by removing the ultra-thin copper layer and the catalyst nuclei by a method such as etching with a corrosive solution such as an acid or etching with plasma; and a step of providing an electroless plating layer in the region where neither the solder resist nor the plating resist is provided.

In the present application, the subtractive method refers to a method in which the unnecessary portion of the copper foil on the copper clad laminate is selectively removed by etching or the like to form a conductor pattern.

Therefore, one embodiment using the subtractive method, of the method for manufacturing a printed wiring board according to the present application comprises a step of preparing the copper foil with carrier according to the present application, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating substrate;

a step of performing desmear treatment on the region including the through-holes or/and the blind vias;

a step of providing an electroless plating layer in the region including the resin and the through-holes or/and the blind vias;

a step of providing an electrolytic plating layer on the surface of the electroless plating layer;

a step of providing an etching resist on the surface of the electrolytic plating layer or/and on the surface of the ultra-thin copper layer;

a step of forming a circuit pattern by exposing the etching resist;

a step of forming a circuit by removing the ultra-thin copper layer and the electroless plating layer and the electrolytic plating layer, by a method such as etching with a corrosive solution such as an acid or etching with plasma; and a step of removing the etching resist.

Another embodiment using the subtractive method, of the method for manufacturing a printed wiring board according to the present application comprises a step of preparing the copper foil with carrier according to the present application, and an insulating substrate;

a step of laminating the copper foil with carrier and the insulating substrate;

after laminating the copper foil with carrier and the insulating substrate, a step of peeling off the carrier of the copper foil with carrier;

a step of providing through-holes and/or blind vias in the ultra-thin copper layer which is exposed by peeling off the carrier and in the insulating substrate;

a step of performing desmear treatment on the region including the through-holes or/and the blind vias;

a step of providing an electroless plating layer in the region including the resin and the through-holes or/and the blind vias;

a step of forming a mask on the surface of the electroless plating layer;

a step of providing an electrolytic plating layer on the surface of the electroless plating layer where no mask is formed thereon;

a step of providing an etching resist on the surface of the electrolytic plating layer or/and on the surface of the ultra-thin copper layer;

a step of forming a circuit pattern by exposing the etching resist;

a step of forming a circuit by removing the ultra-thin copper layer and the electroless plating layer, by a method such as etching with a corrosive solution such as an acid or etching with plasma; and a step of removing the etching resist.

The step of providing through-holes or/and blind vias, and the subsequent desmear step may be omitted.

Here, a specific embodiment of the method for producing a printed wiring board, using the copper foil with carrier according to the present application is described in detail.

First, as shown in FIG. 1A, a copper foil with carrier (a first layer) having an ultra-thin copper layer with a roughening treatment layer on the surface of the copper foil is prepared.

Figure 1B:
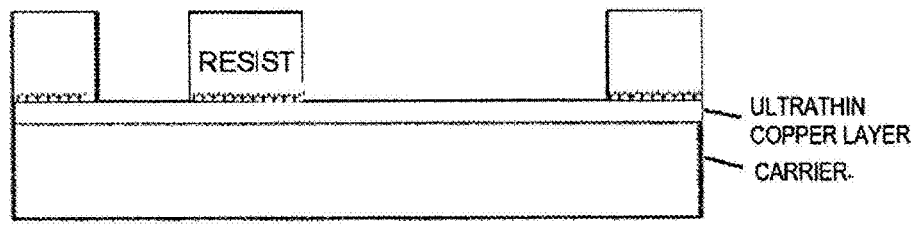

Next, as shown in FIG. 1B, a resist is applied on the roughening treatment layer of the ultra-thin copper layer, and exposure and development are performed to etch the resist into a predetermined shape.

Figure 1C:
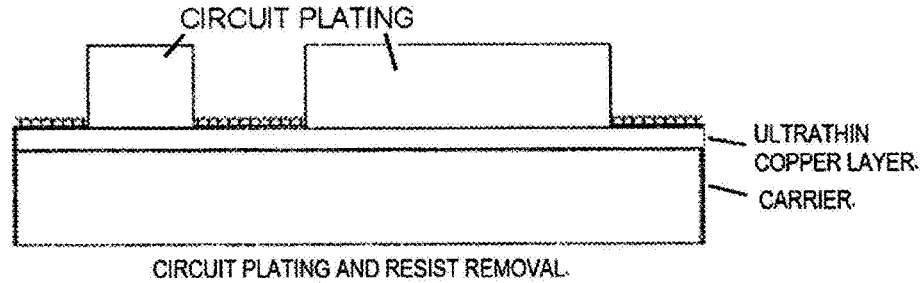

Next, as shown in FIG. 1C, after forming a plating for a circuit, the resist is removed, and thus a circuit plating having a predetermined shape is formed.

Figure 2A:
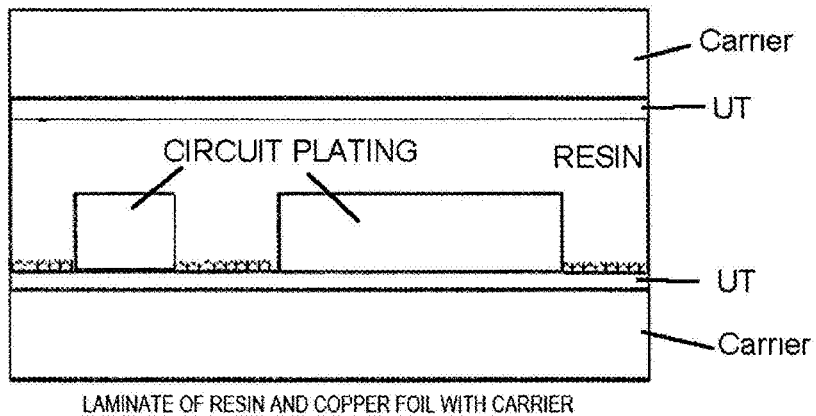
FIGS. 2A, 2B and 2C are schematic views of the cross section of the wiring board in the process from laminating a resin and a second copper foil with carrier to laser drilling, according to one embodiment of the method for manufacturing a printed wiring board using the copper foil with carrier according to the present application.

Next, as shown in FIG. 2A, a resin layer is laminated on the ultra-thin copper layer by providing embedding resin so that the circuit plating is covered (so that the circuit plating is embedded), and then another copper foil with carrier (a second layer) is bonded from the ultra-thin copper layer side.

Figure 2B:
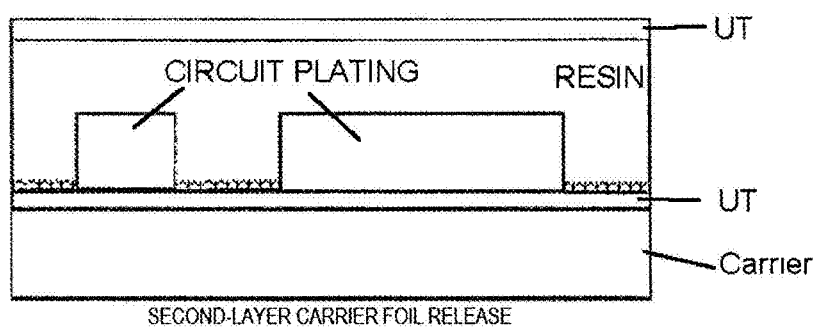

Next, as shown in FIG. 2B, the carrier is peeled off from the copper foil with carrier (from the second layer).

Figure 2C:
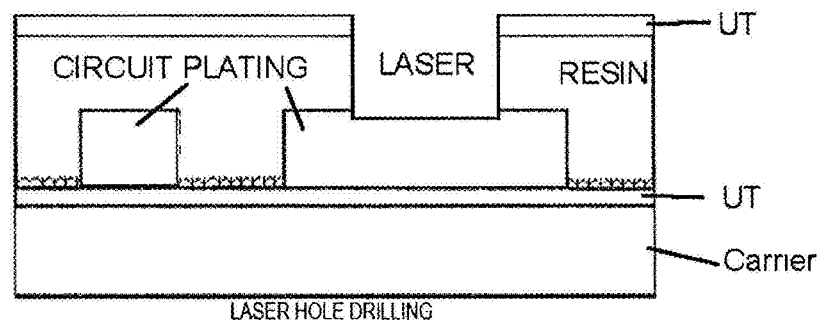

Next, as shown in FIG. 2C, laser drilling is performed at predetermined positions of the resin layer, or the copper foil and the resin layer, and thus the circuit plating is exposed to form a blind via.

Figure 3A:
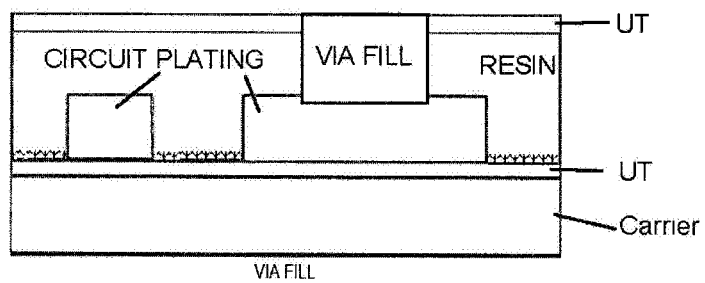
FIGS. 3A, 3B and 3C are schematic views of the cross section of the wiring board in the process from formation of a via fill to peeling off the carrier of the first layer, according to one embodiment of the method for manufacturing a printed wiring board using the copper foil with carrier according to the present application.

Next, as shown in FIG. 3A, copper is implanted into the blind via to form a via fill.

Figure 3B:
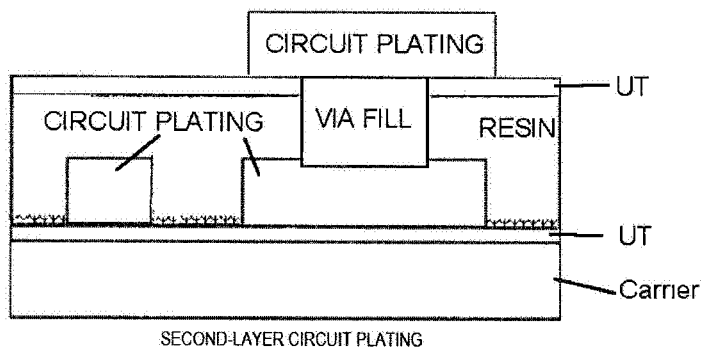

Next, as shown in FIG. 3B, a circuit plating is formed in the same manner as shown in above-described FIG. 1B and FIG. 1C.

Figure 3C:
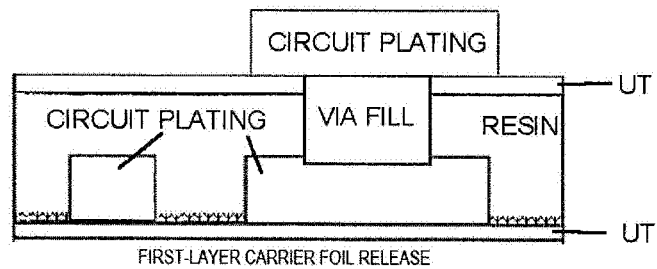

Next, as shown in FIG. 3C, the carrier is peeled off from the copper foil with carrier (from the first layer).

Figure 4A:
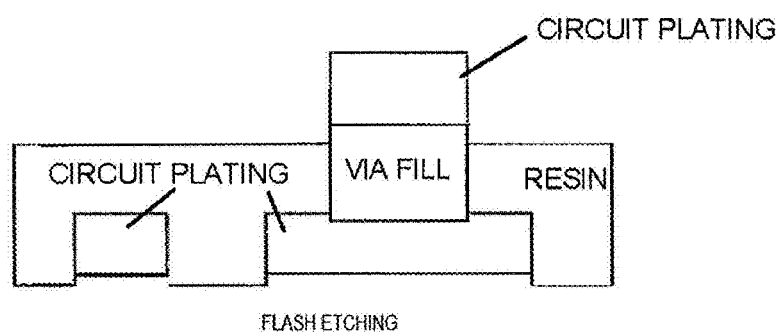
FIGS. 4A and 4B are schematic views of the cross section of the wiring board in the process from flash etching to formation of a bump and a copper pillar, according to one embodiment of the method for manufacturing a printed wiring board using the copper foil with carrier according to the present application.

Next, as shown in FIG. 4A, by flash etching, the ultra-thin copper layers on both surfaces are removed, to expose the surface of the circuit plating in the resin layer.

Figure 4B:
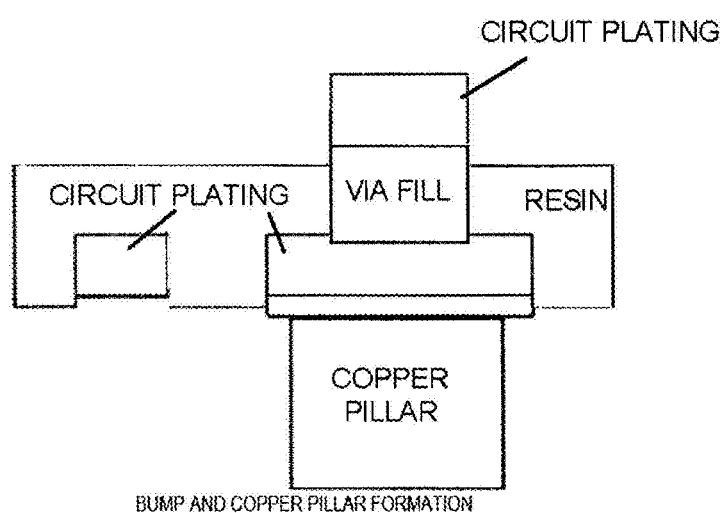

Next, as shown in FIG. 4B, a bump is formed on the circuit plating in the resin layer, and a copper pillar is formed on the solder concerned. In this way, a printed wiring board using the copper foil with carrier according to the present application can be manufactured.

Further, in the above-described method of manufacturing a printed wiring board, it is also possible to read "ultra-thin copper layer" as a carrier and "carrier" as an ultra-thin copper layer, and in this case, it is also possible to form a circuit on the carrier-side surface of the copper foil with carrier and embed the circuit with a resin to manufacture a printed wiring board As the "another copper foil with carrier" (the second layer), the copper foil with carrier according to the present application may be used, or a conventional copper foil with carrier may also be used, and moreover, an ordinary copper foil may also be used. In addition, on the circuit on the second layer as shown in FIG. 3B, a layer of a circuit or a plurality of layers of circuit may be formed, and the formation of these circuits may also be performed by a semi-additive method, a subtractive method, a partly additive method or a modified semi-additive method.

According to such a method for producing a printed wiring board as described above, because of the constitution allowing the circuit plating to be embedded in the resin layer, during removing the ultra-thin copper layer by flash etching, for example, as shown in FIG. 4A, the circuit plating is protected by the resin layer, and the shape of the circuit plating is maintained, and accordingly the formation of a fine circuit is facilitated. In addition, because the circuit plating is protected by the resin layer, the migration resistance is improved and the conduction of the circuit wiring is suppressed satisfactorily. Accordingly, the formation of a fine circuit is facilitated. As shown in FIG. 4A and FIG. 4B, when the ultra-thin copper layer is removed by flash etching, the exposed surface of the circuit plating has a shape recessed from the resin layer, and hence the formation of a bump on the circuit plating concerned, and moreover the formation of a copper pillar thereon are facilitated to improve the production efficiency.

As the embedding resin, known resins and prepregs can be used. For example, BT (bismaleimide triazine) resin, a prepreg being a glass cloth impregnated with BT resin, and the ABF film and ABF manufactured by Ajinomoto Fine-Techno Co., Ltd. can be used. As the embedding resin, the resin layer and/or the resin and/or the prepreg described in the present description can also be used.

The copper foil with carrier used as the first layer may have a substrate or a resin layer on the surface of the copper foil with carrier. By having the substrate or the resin layer, the copper foil with carrier used as the first layer is supported and hardly undergoes wrinkles so that there is an advantage that the productivity is improved. As the substrate or the resin layer, any substrate or resin layer can be used as long as it can support the copper foil with carrier used as the first layer. For example, as the substrate or the resin layer, the carriers, the prepregs, and the resin layers described in the present specifications, and known carriers, prepregs, resin layers, metal plates, metal foils, plates of inorganic compounds, foils of inorganic compounds, plates of organic compounds and foils of organic compounds can be used.

According to another embodiment, the present application is a method for manufacturing a printed wiring board, comprising a step of laminating the ultrathin copper layer side surface or the carrier side surface of the copper foil with carrier according to the present application, and a resin substrate; a step of forming, at least once, a resin layer and a circuit, on the surface of the side of the ultra-thin copper layer which is laminated with the resin substrate, or on the surface of the copper foil with carrier which is on the side opposite to the carrier side surface; and after forming the resin layer and the circuit, a step of or peeling off the carrier or the ultra-thin copper layer from the copper foil with carrier (a coreless method).

As a specific example of the coreless method, first, the ultrathin copper layer side surface or the carrier side surface of the copper foil with carrier according to the present application is laminated with a resin substrate to form a laminate (also referred to as a copper clad laminate). Thereafter, a resin layer is formed on the surface of the ultra-thin copper layer laminated with the resin substrate or on the surface of the copper foil which is on the side opposite to the carrier side surface. As to the resin layer formed on the carrier side surface or on the ultra-thin copper layer side surface, another copper foil with carrier may be further laminated from the carrier side or the ultrathin copper layer side thereof.

Further, the above-described method for manufacturing a printed wiring board can also be applied to a laminate comprising, a resin substrate or a resin or a prepreg as a center, and two copper foils with carrier laminated on the surface of both sides of the resin substrate or the resin or the prepreg, the copper foils with carrier being laminated in the order of carrier/intermediate layer/ultra-thin copper layer or in the order of ultra-thin copper foil/intermediate layer/carrier, or can be applied to a laminate comprising, a resin substrate or a resin or a prepreg as a center, and layers laminated on the surface of both sides of the resin substrate or the resin or the prepreg, the layers being laminated in the order of "carrier/intermediate layer/ultrathin copper layer/resin substrate or resin or prepreg/carrier/intermediate layer/ultra-thin copper layer", or can be applied to a laminate comprising, a resin substrate or a resin or a prepreg as a center, and layers laminated on the surface of both sides of the resin substrate or the resin or the prepreg, the layers being laminated in the order of "carrier/intermediate layer/ultrathin copper layer/resin substrate/carrier/intermediate layer/ultra-thin copper layer", or can be applied to a laminate comprising, a resin substrate or a resin or a prepreg as a center, and layers laminated on the surface of both sides of the resin substrate or the resin or the prepreg, the layers being laminated in the order of "ultra-thin copper layer/intermediate layer/carrier/resin substrate/carrier/intermediate layer/ultra-thin copper layer". Furthermore, it is possible to form another resin layer on the exposed surfaces of the ultra-thin copper layer(s) or the carrier(s), which are at the two ends of the laminate, and then form a copper layer or a metal layer, and then form a circuit by processing the copper layer or the metal layer. Furthermore, Further, another resin layer may be provided on the circuit so as to embed the circuit. Further, such circuit and resin layer may be formed one or more times (a build-up method). With respect to the thus formed laminate (hereinafter also referred to as laminate B), the ultra-thin copper layer or the carrier of each copper foil with carrier can be peeled off from the carrier or the ultra-thin copper layer to manufacture a coreless substrate.

Further, to prepare the above-described coreless substrate, it is possible to use a laminate as a center, the laminate, which is to be described layer, being prepared using two copper foils with carrier, having a constitution of ultra-thin copper layer/intermediate layer/carrier/carrier/intermediate layer/ultra-thin copper layer, or a constitution of carrier/intermediate layer/ultra-thin copper layer/ultra-thin copper layer/intermediate layer/carrier, or a constitution of carrier/intermediate layer/ultra-thin copper layer/carrier/intermediate layer/ultra-thin copper layer. With respect to the thus formed laminate (hereinafter also referred to as laminate A), it is possible to form, at least once, a resin layer and a circuit, on the surfaces of the ultra-thin copper layer or the carrier on both sides of the laminate, and after forming, at least once, the resin layer and the circuit, by peeling off the ultra-thin copper layer or the carrier of the copper foil with carrier from the carrier or the ultra-thin copper layer, it is possible to manufacture a coreless substrate.

As to the above-mentioned laminate, other layers can be applied to the surface of the ultra-thin copper layer, to the surface of the carrier, between the carriers, between the ultra-thin copper layers, between the ultra-thin copper layer and the carrier Layer. The other layer may be a resin substrate or a resin layer.

In this specification, when the ultra-thin copper layer or the carrier or the laminate have other layers on the surface of the ultra-thin copper layer or the carrier or the laminate, the terms "surface of the ultra-thin copper layer", "surface of the side of the ultra-thin copper layer", "surface of the ultra-thin copper layer side", "ultrathin copper layer surface", "surface of the carrier", "surface of the side of the carrier", "surface of the carrier side", "carrier surface", "the surface of the laminate" and "the laminate surface" refer to the surface of the other layers (the outermost surface).

Further, it is preferable that the laminate has a structure of an ultra-thin copper layer/intermediate layer/carrier/carrier/intermediate layer/ultra-thin copper layer. This is because, when a coreless substrate is manufactured using the laminate, an ultra-thin copper layer is disposed on the coreless substrate side, so that it becomes easier to form a circuit on the coreless substrate using modified semi-additive method. This is also because, since the ultra-thin copper layer is thin, it is easy to remove the ultra-thin copper layer, and to form a circuit on the coreless substrate by using the semi-additive method after removal of the ultrathin copper layer.

Further, in the present specification, the "laminate", which is not specifically described as "laminate A" or "laminate B", refers to a laminate including at least laminate A and laminate B.

In the method of manufacturing a coreless substrate described above, by covering a part or the whole of the end face of the copper foil with carrier or the laminate (including the laminate A) with a resin, when manufacturing a printed wiring board using the build-up method, it is possible to prevent the chemical solution from penetrating into between one copper foil with carrier and another copper foil with carrier and It is possible to prevent separation of the ultra-thin copper layer and the carrier, and prevent corrosion of the copper foil with carrier caused by the penetration of chemical solution, and eventually improving the yield. As the "resin covering part or the whole of the end face of the copper foil with carrier" or "the resin covering a part or the whole of the end face of the laminate" used herein, a resin or a known resin which can be used as a resin layer can be used. Further, in the method of manufacturing a coreless substrate described above, when viewed from above the copper foil with carrier or the laminate in a plan view, at least part of the periphery of the laminated portion of the copper foil with carrier or the laminate (the laminated portion of the carrier and the ultra-thin copper layer, or the laminated portion of the carrier with copper foil and another copper foil with carrier) may be covered with a resin or a prepreg. Further, the laminate (laminate A) formed by the method for manufacturing a coreless substrate described above may be constituted by bringing a pair of copper foils with carrier into contact with each other in a separable manner. Further, when viewed from above the copper foil with carrier or the laminate in a plan view, the entire periphery or the entire surface of the laminated portion of the copper foil with carrier or the laminate (the laminated portion of the carrier and the ultra-thin copper layer, or the laminated portion of the carrier with copper foil and another copper foil with carrier) may be covered with a resin or a prepreg. Further, in a plan view, it is preferable that the resin or prepreg is larger than the copper foil with carrier, or larger than the laminate, or larger than the laminated portion of the laminate. It is preferable that the resin or the prepreg is laminated on both sides of the copper foil with carrier or the laminate, and the copper foil with carrier or the laminate having a structure in which the copper foil with carrier or the laminate is packed (wrapped) by the resin or the prepreg. With such a configuration, when the copper foil with carrier or the laminate is viewed in a plan view, the laminated portion of the copper foil with carrier or the laminate is covered with the resin or the prepreg, and the members are blocked in the side direction, that is, from the lateral direction with respect to the stacking direction, and as a result, it is possible to reduce peeling between the carrier and the ultra-thin copper layer or between copper foils with carrier during handling. In addition, by covering the periphery of the laminated portion of the copper foil with carrier or the laminate with a resin or a prepreg so as not to expose the periphery thereof, it is possible to prevent the chemical solution from entering the interface of the laminated portion during the chemical solution treatment step as described above, and corrosion and erosion of the copper foil with carrier can be prevented. When one copper foil with carrier is separated from a pair of copper foils with carrier of the laminate, or when the carrier and the copper foil (the ultra-thin copper layer) of the copper foil with carrier are separated, if the laminated portion of the copper foil or the laminate (the laminated portion of the carrier and the carrier, or the laminated portion of one copper foil with carrier and another copper foil with carrier), which is covered with the resin or the prepreg, is firmed adhered by the resin or the prepreg or the like, it may be necessary to remove the laminated portion etc. by cutting or the like.

The laminate according to the present application may have two copper foils with carrier according to the present application. Specifically, from the carrier side or the ultra-thin copper layer side of one copper foil with carrier according to the present application, another copper foil with carrier according to the present application may be laminate on its carrier side or its ultra-thin copper layer side. Also, a laminate may be obtained by directly laminate the carrier side or the ultra-thin copper layer side of the above-described "one copper foil with carrier" and the carrier side or the ultra-thin copper layer of the above-described "another copper foil with carrier", with an adhesive interposed between them, if necessary. In addition, the carrier or the ultra-thin copper layer of the "one copper foil with carrier" may be bonded to the carrier or the ultra-thin copper layer of the "another copper foil may with carrier". Here, the term "bonded" also includes a case where, the carrier or the ultra-thin copper layer has a surface treatment layer, and they are bonded to each other with the surface treatment layer interposed between them. In addition, a part or the whole of the end face of the laminate may be covered with a resin.

Lamination of carriers, ultra-thin copper layers, a carrier and an ultra-thin copper layer, or copper foils with carrier, can be performed simply by superimposing, or for example, by the following method.

(a) Metallurgical bonding method: welding (arc welding, TIG (Tungsten Inert Gas) welding, MIG (Metal Inert Gas) welding, resistance welding, seam welding, spot welding), pressure welding (ultrasonic welding, Friction stir welding), brazing;

(b) Mechanical bonding method: caulking, rivet bonding (bonding with self piercing rivet, bonding with rivet), stitcher;

(c) Physical bonding method: Adhesive, (double-sided) adhesive tape

By using the abovementioned bonding methods to bond a part or the whole of one carrier to a part or the whole of another carrier or to apart or the whole of a ultra-thin copper layer, It is possible to manufacture a laminate, wherein the "one carrier" is laminated with the "another carrier" or with the ultra-thin copper layer, and the carriers or the carrier and the ultra-thin copper layer are bonded in a separable manner. In the case where one carrier and the other carrier or the ultra-thin copper layer are weakly bonded and one carrier and the other carrier or the ultra-thin copper layer are laminated, one carrier can be separated from the other carrier or the ultra-thin copper layer even if the joint of the one carrier and the other carrier or the ultra-thin copper layer is not removed. On the other hand, in the case where one carrier and the other carrier or the ultra-thin copper layer are strongly bonded, by cutting or chemically polishing (etching or the like) the joint of the one carrier and the other carrier or the ultra-thin copper layer, it is possible to separate one carrier from the other carrier or the ultra-thin copper layer.

In addition, via a step of forming, at least once, a resin layer and a circuit, on the laminated described above, and after forming, at least once, the resin layer and the circuit, a step of peeling off the ultra-thin copper foil or carrier from the copper foil with carrier of the laminate, a printed wiring board without a core can be manufactured. Further, the resin layer and the circuit may be provided on one or both surfaces of the laminate.

The resin substrate, the resin layer, the resin, and the prepreg used in the above-described laminate may be the resin layer described in this specification, and may include resin, resin curing agent, compounds, curing accelerators, dielectrics, reaction catalysts, crosslinking agents, polymers, prepregs, skeleton members, and the like, which can be used in the resin layer described in this specification. Further, the abovementioned copper foil with carrier or the laminate may be smaller than the resin or prepreg or resin substrate or resin layer in a plan view. Further, a copper clad laminate can be manufactured by laminating and surface treated copper foil according to the present application with the resin substrate, the resin layer, the resin, or the prepreg described above or later. Then, by processing the surface treated copper foil of the copper clad laminate into copper wiring by etching or the like, a printed wiring board can be manufactured.

In addition, the resin substrate is not particularly limited as long as it has properties applicable to printed wiring boards and the like, but for example, for a rigid PWB, paper base phenolic resin, paper base epoxy resin, synthetic fiber cloth base epoxy resin, glass cloth/paper composite base epoxy resin, glass cloth/glass nonwoven fabric composite base epoxy resin and glass cloth base epoxy resin etc. may be used, and for an FPC, polyester film, polyimide film, LCP (Liquid Crystal Polymer) film, fluororesin, a low dielectric polyimide resin film, and COP (Cyclo-Olefin Polymer) resin film etc. can be used. When an LCP (Liquid Crystal Polymer) film or a fluororesin film is used, the peel strength between the film and the surface treated copper foil tends to be smaller than when a polyimide film is used. Therefore, in the case where an LCP (Liquid Crystal Polymer) film or a fluororesin film is used, after forming a circuit, by covering the copper circuit with a coverlay, peeling of the film from the copper circuit, which is caused by the decrease of the peeling strength, can be prevented.

It should be noted that because the dielectric tangent is small in LCP (Liquid Crystal Polymer) film, a fluororesin film, a low dielectric polyimide resin film, and COP (Cyclo-Olefin Polymer) resin film, the copper-clad laminate, the printed wiring board, or the printed circuit board that uses LCP (Liquid Crystal Polymer) film, a fluororesin film, a low dielectric polyimide resin film, or COP (Cyclo-Olefin Polymer) resin film and the surface treated copper foil according to the present application is suitable for use in a high-frequency circuit (a circuit that transmits signals at high frequencies). In addition, because the aspect ratio of the roughening particles of the surface treated copper foil according to the present application are controlled to be prescribed form, it is suitable for use in a high-frequency circuit. Note that polyimide resins of which the value of the dielectric tangent is 0.01 or less is defined as low dielectric polyimide resins in the present specification. The dielectric tangent can be measured by the triplate-line resonator method described in "A test method for copper-clad laminates for printed wiring boards dielectric constant and dissipation factor" JPCA-TM001-2007 published by Japan Electronics Packaging and Circuits Association. The copper-clad laminate may be formed by attaching the copper foil and the insulating substrate via an adhesive. Any adhesive known in the art can be used for the above-described adhesive. For the above-describe adhesive, the use of a low dielectric adhesive is preferable. In the present specification, an adhesive of which the dielectric constant is 3.5 or less is regarded as a low dielectric adhesive. Note that, in the present specification, the values of the dielectric constant (the base material dielectric constant, the substrate dielectric constant, the dielectric constant of resin) and the dielectric tangent (the base material dielectric tangent, the substrate dielectric tangent, the dielectric tangent of resin) refer to the values of the dielectric constant and the dielectric tangent when the signal frequency is 1 GHz.

In addition, the surface treated copper foil or the copper foil with carrier according to the present application can be suitably used as battery material such as a negative current collector of a secondary battery such as a lithium-ion secondary battery. Because the aspect ratio of the roughening particles and the glossiness are controlled to be kept within a prescribed range in the surface treated copper foil or the copper foil with carrier according to the present application, compared with the surface treated copper foil or the copper foil with carrier that is not controlled, the following advantages are found in the surface treated copper foil or the copper foil with carrier according to the present application. The surface treated copper foil or the copper foil with carrier according to the present application has a good adhesive property with active materials. Because a number of the particle dropping is small in a step, for example, of providing an active material on the surface of the surface treated copper foil or the copper foil with carrier, pollution by the roughening particles in a manufacturing facility can be reduced. As another example, when the surface treated copper foil or the copper foil with carrier according to the present application is used as a current collector of a battery or a secondary battery and an active material thin film is formed over the surface treated copper foil or the copper foil with carrier, an electrode can be manufactured. Ultimately, a battery or a secondary battery with the above-described electrode (either a positive electrode or a negative electrode) can be manufactured. A method of forming an active material thin film over a current collector is not particularly limited, but the method includes the CVD technique, the sputtering technique, the vapor deposition technique, the spraying technique, a method of applying a solution containing the active material over a current collector and drying the solution, or a plating technique. From among these techniques and methods of thin film formation, the CVD technique, the sputtering technique, and the vapor deposition technique are particularly preferred. In addition, an intermediate layer may be formed over the current collector and an active material thin film may be formed over the intermediate layer. The surface treated copper foil or the copper foil with carrier according to the present application can be used in any electrodes known in the art, any current collectors known in the art, and any batteries known in the art. The batteries known in the art include a lithium-ion secondary battery, an all-solid secondary battery, an air battery (such as a lithium-air battery, a zinc-air battery), a sodium ion battery, a magnesium ion battery, a multivalent ion battery, a secondary battery using a sulfuric substance as the positive electrode, a secondary battery using a redox-active organic compound as the positive electrode, a nickel-cadmium battery, a manganese battery (a dry-cell battery), an alkaline battery (a dry-cell battery), and a lithium battery (a dry-cell batter), etc. The electrodes known in the art and the current collectors known in the art include the electrodes and the current collectors used in the above-described batteries known in the art.

EXAMPLES

Hereinafter, description will be given based on Examples and Comparative examples. It should be noted all the examples are merely exemplary, and the present invention is not limited to the examples. That is, the present invention includes other embodiments and modifications.

Examples 1 to 34, Comparative Examples 1 to 13, 15, Reference Example 14

Various copper foils are prepared under the conditions described in Table 1, and on one surface of the copper foil, as a roughening treatment, plating treatment was performed under the conditions described in Tables 2 and 3. As to Reference Example 14, treatment 1 and treatment 2 were carried out in this order as shown in Table 3. With regard to the treatment 1, after the treatment of the current density and the plating time described as treatment 1-1, the treatment of the current density and the plating time described as treatment 1-2 was performed.

For Examples 19 to 23, metal foils shown in Table 1 were prepared as various carriers, an intermediate layer was formed on the surface of the carrier under the following conditions, and an ultrathin copper layer was formed on the surface of the intermediate layer. Then, as a roughening treatment, plating was performed under the conditions described in Tables 2 and 3 on the surface of the ultra-thin copper layer.

Example 19

<Intermediate Layer>
(1) Ni Layer (Ni Plating)
The carrier was electroplated with a roll-to-roll type continuous plating line under the following conditions to form a Ni layer having a deposition amount of 1000 μg/dm². Specific plating conditions are described below.
Nickel sulfate: 270 to 280 g/L
Nickel chloride: 35 to 45 g/L
Nickel acetate: 10 to 20 g/L
Boric acid: 30 to 40 g/L
Gloss agent: saccharin, butynediol, etc.
Sodium dodecyl sulfate: 55 to 75 ppm
PH: 4 to 6
Bath temperature: 55 to 65° C.
Current density: 10 A/dm² or less
(2) Cr Layer (Electrolytic Chromate Treatment)
Next, after rinsing (with water) and pickling (with acid) the surface of the Ni layer formed in (1), a Cr layer having a deposition amount of 11 μg/dm² was successively deposited on the Ni layer with a roll-to-roll type continuous plating line by electrolytic chromate treatment under the following conditions.

Potassium dichromate: 1 to 10 g/L, Zinc: 0 g/L
PH: 7 to 10
Liquid temperature: 40 to 60° C.
Current density: 2 A/dm² or less
<Ultrathin Copper Layer>
Next, after rinsing (with water) and pickling (with acid) the surface of the Cr layer formed in (2), an ultrathin copper layer having a thickness of 3 μm was successively formed on the Cr layer with a roll-to-roll type continuous plating line by electroplating under the following conditions, and an ultra-thin copper foil with carrier is manufactured.
Copper concentration: 90 to 110 g/L
Sulfuric acid concentration: 90 to 110 g/L
Chloride ion concentration: 50 to 90 ppm
Leveling agent 1 (bis(3-sulfopropyl)disulfide): 10 to 30 ppm
Leveling agent 2 (amine compound): 10 to 30 ppm
The following amine compound was used as the leveling agent 2.

[Chemical formula 2]

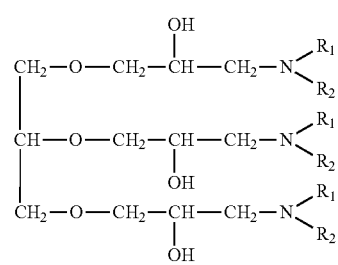

(in the chemical formula, $R_1$ and $R_2$ are respectively a group selected from the group consisting of a hydroxyalkyl group, an ether group, an aryl group, an aromatic substituted alkyl group, an unsaturated hydrocarbon group, and an alkyl group.)
Electrolyte temperature: 50 to 80° C.
Current density: 100 A/dm² or less
Electrolytic solution linear velocity: 1.5 to 5 m/sec Example 20

<Intermediate Layer>
(1) Ni—Mo Layer (Nickel Molybdenum Alloy Plating)
The carrier was electroplated with a roll-to-roll type continuous plating line under the following conditions to form a Ni—Mo layer with a deposition amount of 3000 μg/dm². Specific plating conditions are described below.
(Liquid composition) Ni sulfate hexahydrate: 50 g/dm³, sodium molybdate dihydrate: 60 g/dm³, sodium citrate: 90 g/dm³
(Liquid temperature) 30° C.
(Current density) 1 to 4 A/dm²
(Energization time) 3 to 25 seconds
<Ultrathin Copper Layer>
An ultra-thin copper layer was formed on the Ni—Mo layer formed in (1). The ultra-thin copper layer was formed under the same conditions as in Example 19 except that the thickness of the ultra-thin copper layer was 1.5 μm.

Example 21

<Intermediate Layer>
(1) Ni Layer (Ni Plating)

A Ni layer was formed under the same conditions as in Example 19.

(2) Organic Substance Layer (Organic Substance Layer Formation Treatment)

Next, the surface of the Ni layer formed in (1) was rinsed (with water) and pickled (with acid), and then an aqueous solution containing CBTA (carboxybenzotriazole) at a concentration of 1 to 30 g/L, having a solution temperature of 40° C., a pH of 5, was showered and sprayed for 20 to 120 seconds on the Ni layer, and an organic substance layer was formed.

<Ultrathin Copper Layer>

An ultra-thin copper layer was formed on the organic substance layer formed in (2). The ultra-thin copper layer was formed under the same conditions as in Example 19 except that the thickness of the ultra-thin copper layer was 5 μm.

Examples 22, 23

<Intermediate Layer>
(1) Co—Mo Layer (Cobalt Molybdenum Alloy Plating)

The carrier was electroplated in a roll-to-roll type continuous plating line under the following conditions to form a Co—Mo layer with a deposition amount of 4000 μg/dm$^2$. Specific plating conditions are described below.

(Liquid composition) Cobalt sulfate: 50 g/dm$^3$, sodium molybdate dihydrate: 60 g/dm$^3$, sodium citrate: 90 g/dm$^3$ (Liquid temperature) 30° C.

(Current density) 1 to 4 A/dm$^2$ (Energization time) 3 to 25 seconds

<Ultrathin Copper Layer>

An ultra-thin copper layer was formed on the Co—Mo layer formed in (1). The ultrathin copper layer was formed under the same conditions as in Example 19 except that the thickness of the ultrathin copper layer of Example 22 was 3 μm and the thickness of the ultra-thin copper layer of Example 23 was 1 μm.

After the above-described plating treatment as the roughening treatment (described in Tables 2 and 3), as shown in Table 5, the following heat resistant layer and/or plating treatment for forming a rust preventive layer and/or silane coupling treatment was performed on Examples 1 to 18, 24 to 34, Comparative Examples 9 to 12, 15. Besides, in Table 5, the terms "Ni—Co", "Ni—Co (2)", "Ni—Co (3)", "Ni—P", "Ni—Zn", "Ni—Zn (2), "Ni—Zn (3)", "Ni—W", "chromate" and "silane coupling treatment" refer to the following surface treatments.

The conditions for forming the heat-resistant layer 1 are as follows.

Heat Resistant Layer 1

[Ni—Co]: Nickel-Cobalt Alloy Plating

Liquid composition: 5 to 20 g/L of nickel, 1 to 8 g/L of cobalt

PH: 2 to 3

Liquid temperature: 40 to 60° C.

Current density: 5 to 20 A/dm$^2$

Coulomb quantity: 10 to 20 As/dm$^2$

[Ni—Co (2)]: Nickel-Cobalt Alloy Plating

Liquid composition: 5 to 20 g/L of nickel, 1 to 8 g/L of cobalt

PH: 2 to 3

Liquid temperature: 40 to 60° C.

Current density: 5 to 20 A/dm$^2$

Coulomb quantity: 35 to 50 As/dm$^2$

[Ni—Co (3)]: Nickel-Cobalt Alloy Plating

Liquid composition: 5 to 20 g/L of nickel, 1 to 8 g/L of cobalt

PH: 2 to 3

Liquid temperature: 40 to 60° C.

Current density: 5 to 20 A/dm$^2$

Coulomb quantity: 25 to 35 As/dm$^2$

[Ni—P]: Nickel-Phosphorus Alloy Plating

Liquid composition: 5 to 20 g/L of nickel, 2 to 8 g/L of phosphorus

PH: 2 to 3

Liquid temperature: 40 to 60° C.

Current density: 5 to 20 A/dm$^2$

Coulomb quantity: 10 to 20 As/dm$^2$

Heat Resistant Layer 2

For Examples and Comparative Examples having description in the column of heat resistant layer 2 in Table 5, the heat resistant layer 2 was formed on the copper foil provided with the above heat resistant layer 1. In Comparative Examples 9 to 12, the heat resistant layer 2 was formed without providing the heat resistant layer 1. The conditions for forming the heat resistant layer 2 are as follows.

[Ni—Zn]: Nickel-Zinc Alloy Plating

Liquid composition: 2 to 30 g/L of nickel, 2 to 30 g/L of zinc

PH: 3 to 4

Liquid temperature: 30 to 50° C.

Current density: 1 to 2 A/dm$^2$

Coulomb quantity: 1 to 2 As/dm$^2$

[Ni—Zn (2)]: Nickel-Zinc Alloy Plating

Liquid composition: 2 to 30 g/L of nickel, 2 to 30 g/L of zinc

PH: 3 to 4

Liquid temperature: 30 to 50° C.

Current density: 1 to 2 A/dm$^2$

Coulomb quantity: 3 to 4 As/dm$^2$

[Ni—Zn (3)]: Nickel-Zinc Alloy Plating

Liquid composition: 2 to 30 g/L of nickel, 2 to 30 g/L of zinc

PH: 3 to 4

Liquid temperature: 30 to 50° C.

Current density: 1 to 2 A/dm$^2$

Coulomb quantity: 2 to 3 As/dm$^2$

[Ni—W]: Nickel-Tungsten Alloy Plating

Liquid composition: nickel 2 to 30 g/L, tungsten 0.5 to 20 g/L

PH: 3 to 4

Liquid temperature: 30 to 50° C.

Current density: 1 to 2 A/dm$^2$

Coulomb quantity: 1 to 2 As/dm$^2$

Rust Preventive Layer

A rust preventive layer was further formed on the copper foils (except for Example 23) on which the above-described heat resistant layer 1 and/or 2 is formed, or on which no heat resistant layer is formed. The formation conditions of the rust preventive layer are shown below.

[Chromate]: Chromate Treatment

Liquid composition: potassium dichromate 1 to 10 g/L, zinc 0 to 5 g/L

PH: 3 to 4

Liquid temperature: 50 to 60° C.

Current density: 0 to 2 A/dm$^2$ (for immersion chromate treatment)

Coulomb quantity: 0 to 2 As/dm$^2$ (for immersion chromate treatment)

Weather Resistant Layer

A weather resistant layer was further formed on the copper foil provided with the heat resistant layers 1 or 2 and or rust preventive layer. The formation conditions are shown below.

As a silane coupling agent having an amino group, N-2-(aminoethyl)-3-aminopropyltrimethoxysilane (Example 1 to 5, 12 to 17, 19 to 21, 23 to 26, Comparative Examples 1 to 13, Reference Example 14), N-2-(aminoethyl)-3-aminopropyltriethoxysilane (Examples 6 to 10), N-2-(aminoethyl)-3-aminopropylmethyldimethoxysilane (Example 11), 3-triethoxysilyl-N-(1,3-dimethyl-butylidene) propylamine (Example 18), are coated and dried to form a weather resistant layer. Two or more of these silane coupling agents may be used in combination. Similarly, in Comparative Examples 1 to 12, coating and drying with N-2-(aminoethyl)-3-aminopropyltrimethoxysilane were carried out to form a weather resistant layer.

The rolled copper foil was manufactured as follows. A copper ingot having the composition shown in Table 1 was produced, hot rolled, and then annealed at a continuous annealing line of 300 to 800° C. and cold rolled. The annealing and cold rolling were repeated to obtain a rolled plate having a thickness of 1 to 2 mm. This rolled plate was annealed in a continuous annealing line at 300 to 800° C. and recrystallized, and finally cold rolled to the thickness shown in Table 1 under the conditions shown in Table 1 to obtain a copper foil. "Tough pitch copper" in the column of "Type" in Table 1 indicates tough pitch copper defined in JIS H 3100 C1100 and "oxygen free copper" indicates oxygen free copper standardized in JIS H 3100 C1020. "Tough pitch copper +Ag 100 ppm" means that 100 ppm by mass of Ag was added to the tough pitch copper.

As the electrolytic copper foil, electrolytic copper foil HLP foil manufactured by JX Nippon Mining & Metals Corporation was used. For Examples 19 to 23, a predetermined surface treatment, an intermediate layer, or an ultra-thin copper layer as performed or formed on the deposition surface (the surface opposite to the surface in contact with the electrolytic drum at the time of producing the electrolytic copper foil). In addition, regarding the electrolytic copper foil of Table 1, the surface roughness Rz and the glossiness on the deposition surface side are described.

In Table 1, the points of the copper foil preparation process before the surface treatment are described. "High gloss rolling" means that the final cold rolling (cold rolling after the final recrystallization annealing) was performed with the oil film equivalent value described. "Normal rolling" means that the final cold rolling (cold rolling after final recrystallization annealing) was performed with the oil film equivalent value described.

Various evaluations of the samples of Examples and Comparative Examples prepared as described above were carried out as follows.

Measurement of Surface Roughness (Rz):

Using a contact roughness meter Surfcorder SE-3C manufactured by Kosaka Laboratory Ltd., the ten-point average roughness of the surface of the copper foil before surface treatment including roughening treatment was measured in accordance with JIS B 0601-1982. Under the condition of measurement standard length 0.8 mm, evaluation length 4 mm, cutoff value 0.25 mm, feeding rate 0.1 mm/sec, the measurement position was changed 10 times in the direction perpendicularly to the rolling direction (TD, for electrolytic copper foil in the foil direction perpendicularly to the foil passing direction, that is, in the width direction), and the average value of the 10 measurements was taken as the value of the surface roughness (Rz).

Glossiness:

The glossiness of the surface of the copper foil before surface treatment including roughening treatment and the surface of the copper foil after surface treatment including roughening treatment were measured at an incident angle of 60° in the direction orthogonal to the rolling direction (TD, for an electrolytic copper foil, the direction orthogonal to the foil passing direction), using a glossiness meter, Handy Gloss Meter PG-1, manufactured by Nippon Denshoku Industries, Co., Ltd., based on JIS Z8741. During the above-describe measurement of glossiness, the measurement position was changed 10 times and the average value of the 10 measurements was taken as the value of glossiness.

Visibility:

The surface of the surface treated copper foil on the surface treated side was coated on both sides of a polyimide film (thickness: 25 μm, manufactured by Kaneka Corporation (PIXEO (polyimide type: FRS), polyimide film with adhesive layer for copper clad laminate, PMDA (pyromellitic anhydride) type polyimide film (PMDA-ODA (4,4'-diaminodiphenyl ether) type polyimide film)), and the surface treated copper foil was removed by etching (ferric chloride aqueous solution) to prepare a sample film. With respect to the copper foil subjected to the roughening treatment, the roughened surface of the copper foil was bonded to the above-described polyimide film to prepare the above-described sample film. A printed object (black circle with a diameter of 6 cm) was pasted on one face of the obtained resin layer, and the visibility of the printed object that passed through the resin layer from the opposite face was evaluated. Sample films for which the outline of the black circle of the printed object could be clearly seen for 60% or more of the length of the circumference were rated as "⊚ (double circles)", sample films for which the outline of the black circle could be seen for less than 60% and 50% or more of the length of the circumference were rated as "○ (a circle)" (both cases being considered a pass), and sample films for which the outline of the black circle could be clearly seen for 0% to less than 50% of the length of the circumference and the outline broke were rated as "Δ (a triangle)" (a fail). Besides, in the case where a surface treatment was carried out in order to provide a heat resistant layer, a rust preventive layer, or a weather resistant layer, etc. after a roughening treatment or without roughening treatment on the surface of the copper foil, the above measurement was carried out on the surface of the surface treated copper foil after the surface treatment for the heat resistant layer, the rust preventive layer, or the weather resistant layer, etc. In the case where the surface treated copper foil was an ultra-thin copper layer of a copper foil with a carrier, the roughening treatment surface of the ultra-thin copper layer was subjected to the above measurement.

Color Difference:

Using a color difference meter MiniScan XE Plus manufactured by Hunter Associates Laboratory Inc., the color difference was measured in accordance with JIS Z 8730, using the object color of a white board (when the light source is D65 and the viewing angle is 10°, the tristimulus values of the $X_{10}Y_{10}Z_{10}$ colorimetric system (JIS Z 8701 1999) of the white board are $X_{10}$=80.7, $Y_{10}$=85.6, $Z_{10}$=91.5, and in the L*a*b* colorimetric system, the object color of the white board is L*=94.14, a*=−0.90, b*=0.24) on the surface of a copper heat radiation material as a reference color. Further, as to the above-described color difference meter, the measurement value of the color difference of the white plate is set as ΔE*ab=0, and the measured value of the color difference when covering the measurement hole with a black bag (light trap) is set as ΔE*ab=94.14 to calibrate the color difference. The color difference ΔE*ab is defined as 0 for the white plate and as 94.14 for a black color. The color difference ΔE*ab according to JIS Z 8730 of a minute area such as the surface of a copper circuit or the like can be measured with a known device such as micro surface spectral color difference meter (model: VSS 400, manufactured by Nippon Denshoku Industries Co., Ltd.) or a micro surface spectrophotometer (model: SC-50μ, manufactured by Suga Test Instruments Co., Ltd.) or the like.

Particle Dropping:

Transparent mending tape was stuck on the surface of the surface-treated copper foil on which the surface treatment had been performed, and then the tape was peeled off, and the dropped particles adhering to the adhesive surface of the tape caused the discoloration of the tape. Particle dropping is evaluated by the discoloration of the tape. When there is no discoloration of the tape, the particle dropping was rated as "⊚) (double circles)", when it turned to gray, the particle dropping was rated as "○ (a circle)", and when the tape turned to black, the particle dropping was rated as "× (an X-mark)".

Peel Strength (Adhesive Strength):

The surface of the surface treated side of the surface treated copper foil was coated with a polyimide film (UPILEX made by Ube Industries, Ltd., thickness 25 μm) {UPILEX®-VT, BPDA (biphenyltetracarboxylic dianhydride) type (BPDA-PDA (para-henylenediamine) type) polyimide resin substrate}, and then, in accordance with IPC-TM-650, normal peel strength was measured with a tensile tester Autograph 100. The normal peel strength of 0.5 N/mm or more was evaluated as can be used for laminate substrate applications. Besides, the conditions for laminating the surface treated copper foil and the polyimide film were the conditions recommended by the polyimide film maker. Further, as to Examples 19 to 23, the surface of the surface treated side of the surface treated copper foil was coated with a polyimide film (UPILEX made by Ube Industries, Ltd., thickness 25 μm) {UPILEX®-VT, BPDA (biphenyltetracarboxylic dianhydride) type (BPDA-PDA (para-henylenediamine) type) polyimide resin substrate}, and then, the carrier was peeled off, and a copper plating was performed so that the ultra-thin copper layer laminated with the polyimide film had a thickness of 12 μm, and then the peel strength was measured. Besides, in the case where a surface treatment was carried out in order to provide a heat resistant layer, a rust preventive layer, or a weather resistant layer, etc. after a roughening treatment or without roughening treatment on the surface of the copper foil, the above measurement was carried out on the surface of the surface treated copper foil after the surface treatment for the heat resistant layer, the rust preventive layer, or the weather resistant layer, etc. In the case where the surface treated copper foil was an ultra-thin copper layer of a copper foil with a carrier, the roughening treatment surface of the ultra-thin copper layer was subjected to the above measurement.

Figure 5A:
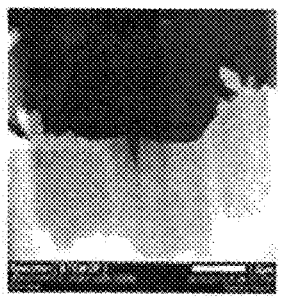
FIGS. 5A, 5B and 5C are explanations of the method for measuring the height (the stack height) of roughening particles of the roughened treatment layer from the surface of the surface treated copper foil.
Figure 5B:
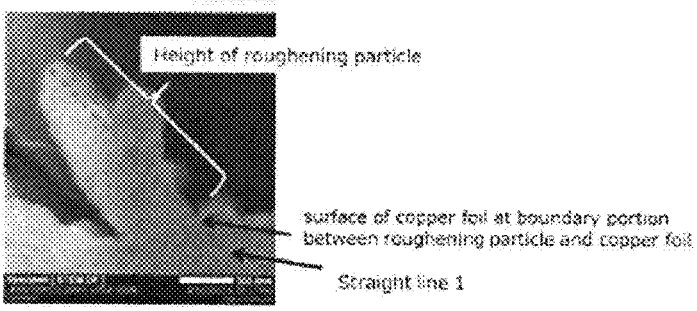

Height of Roughening Particles:

The height (the stacking height) of roughening particles of the roughening treatment layer from the surface of the copper foil was measured on a photograph taken with a transmission electron microscope. Specifically, as shown in FIG. 5A as an example, a section parallel to the thickness direction of the copper foil including the surface of the copper foil and the roughening treatment layer is imaged with a transmission electron microscope to obtain a cross section observation photograph. Next, as shown in FIG. 5B which is an enlarged photograph of the roughening particles in FIG. 5A, for roughening particles in the cross section observation photograph, a straight line 1, which cross the roughening particle and intersect the surface of the copper foil at the boundary portion between the roughening particle and the copper foil, was drawn so that the length from the tip of the roughening particle to the surface of the copper foil becomes maximum. For those roughened particles that are stacked, the stacked roughening particles are collectively regarded as one roughening particle, and the straight line 1 is drawn on the stacked (laminated) roughening particles. Next, the length of the straight line 1 from the tip of the roughening particle to the surface of the copper foil was taken as the height of the roughening particle. When the boundary between the copper foil and the roughening particle was observed in the cross section observation photograph, the boundary between the copper foil and the roughening particle was defined as the surface of the copper foil at the boundary portion between the roughening particle and the copper foil.

Figure 5C:
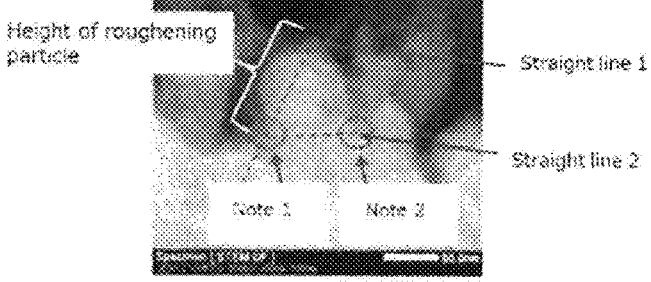

Further, when the boundary between the copper foil and the roughening particle was not observed in the cross section observation photograph, as shown in FIG. 5C, a straight line connecting one point at which a convex portion of the roughening particle starts to develop from the surface of the copper foil (one point of base of the roughening particle) and the other point at which a convex portion of the roughening particle starts to develop from the surface of the copper foil (the other point of base of the roughening particle) is defined as a straight line 2, and the straight line 2 was defined as the surface of the copper foil at the boundary portion between the roughening particle and the copper foil. The particle height (the stack height) of one of the roughening particles is the length of the portion shown in, for example, FIG. 5B and FIG. 5C.

The measurement was carried out on ten roughening particles in random, and the average value thereof was taken as the height of the roughening particles (average of 10 particles).

Thickness of Roughening Particles

The thickness of the roughening particles forming the roughening treatment layer was measured on a photograph taken with a transmission electron microscope. Specifically, as shown in FIG. 5A as an example, a section parallel to the thickness direction of the copper foil including the surface of the copper foil and the roughening treatment layer is imaged with a transmission electron microscope to obtain a cross section observation photograph. Next, as shown in, for example, FIG. 5C, a straight line connecting one point at which a convex portion of the roughening particle starts to develop from the surface of the copper foil (one point of base of the roughening particle) and the other point at which a convex portion of the roughening particle starts to develop from the surface of the copper foil (the other point of base of the roughening particle) is defined as a straight line 2, and the length of the straight line 2 was taken as the thickness of one of the roughening particles.

The measurement was carried out on ten roughening particles in random, and the average value thereof was taken as the thickness of the roughening particles (average of 10 particles).

Aspect Ratio of Roughening Particles:

A ratio of the abovementioned height of roughening particles (average of 10 particles) and the abovementioned thickness of the roughening particles (average of 10 particles) was calculated to be the aspect ratio being "a height of the roughening particles"/"a thickness of the roughening particles".

Productivity:

After a roughening plating as a surface treatment, when the thickness of the roughening particles is small and the height of the roughening particles is big, it is easy to break when pressure is applied, and the roughening particles tend to drop off by roll conveyance at the time of conveyance in a slit line cutting both ends in the width direction of the copper foil. The roughening particles dropped off and adhered to the rolls and the like become stuck as the copper foil is conveyed and cause defects such as pushing scratches and dents when the copper foil is being conveyed.

Therefore, in the slit line cutting the edge of the copper foil, the transport roll for the copper foil is often cleaned once every several thousand meters of the copper foil has been conveyed. Accordingly, the productivity was evaluated by the degree of contamination state of the transport roll of the slit line. That is, when the degree of contamination is light, the cleaning frequency of the transport roll can be lowered, so that productivity is improved. After cleaning the transport roll, the surface condition of the roll after transferring the copper foil to a length of 5000 m from the start of transport of the copper foil was observed. And the productivity was rated as follows.

⊚ (double circles): a state in which roughening particles stuck to the surface of the transport roll is hardly observed, and the transport roll is hardly contaminated ○ (a circle): a state in which roughening particles stuck to the surface of the transport roll is partially observed x (an X-mark): a state in which roughening particles stuck to the surface of the transport roll is observed on almost the entire surface of the transport roll surface Evaluation of Copper Foil Wrinkles etc. by Lamination Process Each of the surface treated copper foil of the Examples or Comparative Examples was superimposed, from the side having a roughening treatment layer, on both surfaces of a polyimide resin having a thickness of 25 μm (manufactured by Kaneka Corporation (PIXEO (polyimide type: FRS), polyimide film with adhesive layer for copper clad laminate, PMDA (pyromellitic anhydride) type polyimide film (PMDA-ODA (4,4'-diaminodiphenyl ether) type polyimide film)). Further, in a state in which a protective film (made of polyimide) having a thickness of 125 μm was laminated on the surface of each surface treated copper foil opposite to the side laminated to the abovementioned polyimide resin, that is in a state of 5 layers of protective film/surface treated copper foil/polyimide resin/surface treated copper foil/protective film, a bonding process (a laminating process) is performed by applying heat and pressure from the outside of both protective films using a laminating roll, and the surface treated copper foil was laminated on both sides of the polyimide resin. Subsequently, after peeling off the protective films on both surfaces, the surface of the surface treated copper foil opposite to the side laminated to the abovementioned polyimide resin was visually observed to check the presence or absence of wrinkles or streaks, and the case where no wrinkles or streaks occurred was rated as "⊚ (double circles)", the case where only one wrinkle or streak was observed per 5 m copper foil length was rated as "○ (a circle)", and the case where wrinkles or streaks were observed at two or more places per 5 m copper foil length was rated as "x (an X-mark)".

Evaluation of Etching Property

The surface treated copper foil was laminated, from the side of the surface treated surface, on both surfaces of a polyimide film with thermosetting adhesive layer for laminate (thickness 25 μm, UPILEX made by Ube Industries, Ltd.) {UPILEX®-VT, BPDA (biphenyltetracarboxylic dianhydride) type (BPDA-PDA (para-henylenediamine) type) polyimide resin substrate}. In order to form the fine pattern circuit, it is necessary to make the thickness of the copper foil the same, here, a copper foil thickness of 12 μm is used as a reference. That is, when the thickness is greater than 12 μm, the thickness was reduced to 12 μm by electrolytic polishing. On the other hand, when the thickness was thinner than 12 μm, the thickness was increased to 12 μm by copper plating treatment. In the cases where the surface treated copper foil is an ultra-thin copper layer of a copper foil with carrier, the copper foil with carrier was laminated, from the side of the ultra-thin copper layer, on both surfaces of the abovementioned polyimide film with thermosetting adhesive layer for laminate, and the carrier was peeled off, and then copper plating treatment was performed to increase the thickness until the total thickness of the ultra-thin copper layer and the copper plating became 12 μm. Subsequently, on one side of the obtained double-sided laminate, by attaching a dry film resist on the copper foil glossy surface side of the laminate and an exposing process, a fine pattern circuit was printed, and then etching unnecessary portions of the copper foil under the following conditions, a fine pattern circuit having L/S=30/30 μm was formed. Here, the circuit width was set so that the bottom width of the circuit cross section was 30 μm.

(Etching Conditions)

Apparatus: spray type compact etching apparatus

Spray pressure: 0.2 MPa

Etching solution: ferric chloride aqueous solution (specific gravity 40 Baume)

Liquid temperature: 50° C.

After forming the fine pattern circuit, it was immersed in an NaOH aqueous solution at 45° C. for 1 minute, and the photosensitive resist film was peeled off.

Using pictures from a scanning electron microscope S4700 manufactured by Hitachi High-Technologies Corporation, the circuit bottom portion of the fine pattern circuit sample obtained above was observed at a magnification of 5000 times, and the case where no etching residue was observed at all 10 observation points was rated as "⊚ (double circles)", the case where etching residue was observed at one of 10 observation points was rated as "○ (a circle)", the case where etching residue was observed at two or more of the 10 observation points was rated as "Δ (a triangle)".

Besides, in the case where a surface treatment was carried out in order to provide a heat resistant layer, a rust preventive layer, or a weather resistant layer, etc. after a roughening treatment or without roughening treatment on the surface of the copper foil or the ultra-thin copper layer of the copper foil with carrier, the above measurement was carried out on the surface of the surface treated copper foil after the surface treatment for the heat resistant layer, the rust preventive layer, or the weather resistant layer, etc.

Tables 1 to 5 show the manufacturing conditions and the evaluation results of Examples and Comparative Examples.

TABLE 1

| | metal foil | | | | |
|---|---|---|---|---|---|
| | type | process | thickness (μm) | roughness TD Rz (μm) | glossiness (TD) (%) |
| Example 1 | oxygen free copper + Ag 100 ppm | normal rolling oil film equivalent value 25000 | 12 | 0.61 | 280 |
| Example 2 | oxygen free copper + Ag 100 ppm | normal rolling oil film equivalent value 25000 | 12 | 0.60 | 280 |
| Example 3 | oxygen free copper + Ag 100 ppm | normal rolling oil film equivalent value 25000 | 12 | 0.60 | 280 |
| Example 4 | oxygen free copper + Ag 100 ppm | normal rolling oil film equivalent value 25000 | 12 | 0.60 | 280 |
| Example 5 | oxygen free copper + Ag 30 ppm | normal rolling oil film equivalent value 25000 | 12 | 0.60 | 280 |
| Example 6 | oxygen free copper + Ag 30 ppm | normal rolling oil film equivalent value 25000 | 12 | 0.60 | 280 |
| Example 7 | oxygen free copper + Ag 30 ppm | normal rolling oil film equivalent value 25000 | 12 | 0.60 | 280 |
| Example 8 | oxygen free copper + Ag 30 ppm | normal rolling oil film equivalent value 25000 | 12 | 0.60 | 280 |
| Example 9 | tough pitch copper + Ag 190 ppm | normal rolling oil film equivalent value 26000 | 18 | 0.65 | 250 |
| Example 10 | tough pitch copper + Ag 190 ppm | normal rolling oil film equivalent value 26000 | 18 | 0.65 | 250 |
| Example 11-1 | tough pitch copper + Ag 190 ppm | normal rolling oil film equivalent value 26000 | 18 | 0.65 | 250 |
| Example 11-2 | tough pitch copper + Ag 190 ppm | normal rolling oil film equivalent value 26000 | 18 | 0.65 | 250 |
| Example 11-3 | tough pitch copper + Ag 190 ppm | normal rolling oil film equivalent value 26000 | 18 | 0.65 | 250 |
| Example 11-4 | tough pitch copper + Ag 190 ppm | normal rolling oil film equivalent value 26000 | 18 | 0.65 | 250 |
| Example 11-5 | tough pitch copper + Ag 190 ppm | normal rolling oil film equivalent value 26000 | 18 | 0.65 | 250 |
| Example 12 | tough pitch copper + Ag 190 ppm | normal rolling oil film equivalent value 26000 | 18 | 0.65 | 250 |
| Example 13 | tough pitch copper + Ag 190 ppm | normal rolling oil film equivalent value 26000 | 18 | 0.65 | 250 |
| Example 14 | tough pitch copper + Ag 190 ppm | normal rolling oil film equivalent value 26000 | 18 | 0.65 | 250 |
| Example 15 | tough pitch copper + Ag 190 ppm | normal rolling oil film equivalent value 26000 | 18 | 0.65 | 250 |
| Example 16 | oxygen free copper + Ag 100 ppm | normal rolling oil film equivalent value 25000 | 12 | 0.60 | 280 |
| Example 17 | oxygen free copper + Ag 100 ppm | normal rolling oil film equivalent value 28000 | 12 | 0.71 | 230 |
| Example 18 | oxygen free copper + Ag 100 ppm | normal rolling oil film equivalent value 30000 | 12 | 0.80 | 200 |
| Example 19 | electrolytic copper foil | — | 12 | 0.68 | 321 |
| Example 20 | electrolytic copper foil | — | 12 | 0.68 | 321 |
| Example 21 | electrolytic copper foil | — | 12 | 0.85 | 295 |
| Example 22 | electrolytic copper foil | — | 12 | 0.85 | 295 |
| Example 23 | electrolytic copper foil | — | 12 | 0.85 | 295 |
| Example 24 | oxygen free copper + Ag 30 ppm | normal rolling oil film equivalent value 25000 | 12 | 0.61 | 279 |
| Example 25 | oxygen free copper + Ag 30 ppm | normal rolling oil film equivalent value 25000 | 12 | 0.60 | 280 |
| Example 26 | oxygen free copper + Ag 100 ppm | normal rolling oil film equivalent value 25000 | 12 | 0.61 | 280 |
| Example 27 | tough pitch copper | normal rolling oil film equivalent value 25000 | 12 | 0.60 | 280 |
| Example 28 | oxygen free copper + Ag 100 ppm | normal rolling oil film equivalent value 25000 | 12 | 0.61 | 280 |
| Example 29 | oxygen free copper + Ag 100 ppm | normal rolling oil film equivalent value 25000 | 12 | 0.61 | 280 |
| Example 30 | oxygen free copper + Ag 100 ppm | normal rolling oil film equivalent value 25000 | 12 | 0.61 | 280 |
| Example 31 | oxygen free copper + Ag 100 ppm | normal rolling oil film equivalent value 25000 | 12 | 0.61 | 280 |
| Example 32 | oxygen free copper + Ag 100 ppm | normal rolling oil film equivalent value 25000 | 12 | 0.61 | 280 |
| Example 33 | oxygen free copper + Ag 100 ppm | normal rolling oil film equivalent value 25000 | 12 | 0.61 | 280 |
| Example 34 | oxygen free copper + Ag 100 ppm | normal rolling oil film equivalent value 25000 | 12 | 0.61 | 280 |
| Comparative Example 1 | oxygen free copper + Ag 100 ppm | normal rolling oil film equivalent value 25000 | 12 | 0.61 | 280 |

TABLE 1-continued

| | metal foil | | | | |
|---|---|---|---|---|---|
| | type | process | thickness (μm) | roughness TD Rz (μm) | glossiness (TD) (%) |
| Comparative Example 2 | oxygen free copper + Ag 100 ppm | normal rolling oil film equivalent value 25000 | 12 | 0.61 | 280 |
| Comparative Example 3 | oxygen free copper + Ag 100 ppm | normal rolling oil film equivalent value 25000 | 12 | 0.61 | 280 |
| Comparative Example 4 | oxygen free copper + Ag 100 ppm | normal rolling oil film equivalent value 25000 | 12 | 0.61 | 280 |
| Comparative Example 5 | oxygen free copper + Ag 30 ppm | normal rolling oil film equivalent value 25000 | 12 | 0.61 | 280 |
| Comparative Example 6 | oxygen free copper + Ag 30 ppm | normal rolling oil film equivalent value 25000 | 12 | 0.61 | 280 |
| Comparative Example 7 | oxygen free copper + Ag 30 ppm | high gloss rolling oil film equivalent value 17000 | 12 | 0.39 | 540 |
| Comparative Example 8 | oxygen free copper + Ag 30 ppm | normal rolling oil film equivalent value 25000 | 12 | 0.61 | 279 |
| Comparative Example 9 | oxygen free copper + Ag 30 ppm | normal rolling oil film equivalent value 25000 | 12 | 0.61 | 279 |
| Comparative Example 10 | oxygen free copper + Ag 30 ppm | normal rolling oil film equivalent value 25000 | 12 | 0.61 | 279 |
| Comparative Example 11 | oxygen free copper + Ag 30 ppm | normal rolling oil film equivalent value 25000 | 12 | 0.61 | 279 |
| Comparative Example 12 | oxygen free copper + Ag 30 ppm | normal rolling oil film equivalent value 25000 | 12 | 0.61 | 279 |
| Comparative Example 13 | oxygen free copper + Ag 30 ppm | high gloss rolling oil film equivalent value 15000 | 12 | 0.25 | 513 |
| Reference Example 14 | oxygen free copper + Ag 100 ppm | normal rolling oil film equivalent value 25000 | 12 | 0.61 | 280 |
| Comparative Example 15 | oxygen free copper + Ag 100 ppm | normal rolling oil film equivalent value 25000 | 12 | 0.61 | 280 |

Example 19 to 23 refer to carriers of a copper foil with carrier.

TABLE 2

| | roughening plating bath | current density A/dm² | plating time sec |
|---|---|---|---|
| Example 1 | Cu: 15 g/L | 20 | 0.3 |
| Example 2 | Co: 10 g/L | | 0.5 |
| Example 3 | Ni: 10 g/L | | 0.7 |
| Example 4 | pH 3, 51° C. | | 0.9 |
| Example 5, 12 | Cu: 14 g/L | 35 | 0.3 |
| Example 6, 13 | Co: 9 g/L | | 0.5 |
| Example 7, 14 | Ni: 9 g/L | | 0.7 |
| Example 8, 15 | pH 3, 55° C. | | 0.9 |
| Example 9, 16 | Cu: 15 g/L | 50 | 0.3 |
| Example 10, 17 | Co: 10 g/L | | 0.5 |
| Example 11-1, 18 | Ni: 10 g/L | | 1.0 |
| Comparative Example 1 | pH 3, 60° C. | | 1.2 |
| Comparative Example 2 | | | 1.6 |
| Example 11-2 | Cu: 15 g/L, Co: 10 g/L, Ni: 10 g/L, pH 3, 55° C. | 50 | 1.0 |
| Example 11-3 | Cu: 15 g/L, Co: 10 g/L, Ni: 10 g/L, pH 3, 51° C. | 50 | 1.0 |
| Example 11-4 | Cu: 15 g/L, Co: 10 g/L, Ni: 10 g/L, pH3, 45° C. | 50 | 1.0 |
| Example 11-5 | Cu: 15 g/L, Co: 10 g/L, Ni: 10 g/L, pH 3, 40° C. | 50 | 1.0 |
| Comparative Example 3 | Cu: 15 g/L | 60 | 1.0 |
| Comparative Example 4 | Co: 10 g/L | | 1.1 |
| Comparative Example 5 | Ni: 10 g/L | | 1.2 |
| Comparative Example 6 | pH 3, 60° C. | | 1.4 |
| Comparative Example 7 | | | 1.6 |
| Example 19 | Cu: 15 g/L | 10 | 0.5 |
| Example 20 | Co: 10 g/L | 20 | 0.3 |
| Example 21 | Ni: 10 g/L | 35 | 0.5 |
| Example 22 | pH 3, 60° C. | 50 | 0.5 |
| Example 23 | | 60 | 0.5 |
| Comparative Example 8 | Cu: 20 g/L | 10 | 0.1 |
| Comparative Example 9 | Co: 10 g/L | | 0.1 |
| Comparative Example 10 | Ni: 10 g/L | | 0.1 |
| Comparative Example 11 | pH 3, 60° C. | | 0.1 |
| Comparative Example 12 | | | 0.1 |

TABLE 3

| | roughening plating bath | current density A/dm² | plating time sec |
|---|---|---|---|
| Example 24 | Cu: 15 g/L, Co: 10 g/L, Ni: 10 g/L, pH 3, 60° C. | 10 | 0.2 |
| Example 25 | Cu: 20 g/L, Ni: 5 g/L, P: 1 g/L, pH 2, 55° C. | 35 | 0.9 |
| Example 26 | Cu: 5 g/L, Co: 16 g/L, Ni: 16 g/L, W: 1 g/L, pH 3, 55° C. | 20 | 0.3 |
| Example 27 | Cu: 10 g/L, Ni: 10 g/L, Mo: 2 g/L, P: 1 g/L, pH 3, 55° C. | 30 | 0.7 |

TABLE 3-continued

|  | roughening plating bath | current density A/dm² | plating time sec |
|---|---|---|---|
| Example 28 | Cu: 20 g/L, Ni: 10 g/L, | 50 | 1.2 |
| Example 29 | Co: 10 g/L, pH 3, 60° C. |  | 1.6 |
| Example 30 | Cu: 25 g/L, Co: 10 g/L, | 60 | 1.0 |
| Example 31 | Ni: 10 g/L, pH 3, 60° C. |  | 1.1 |
| Example 32 |  |  | 1.2 |
| Example 33 |  |  | 1.4 |
| Example 34 |  |  | 1.6 |
| Comparative Example 13 | Cu: 15 g/L, Co: 9 g/L, Ni: 9 g/L, pH 3, 38° C. | 35 | 0.5 |
| Reference Example 14 | treatment 1: Cu: 15 g/L, H₂SO₄: 75 g/L, 30° C. | treatment 1-1: 65 treatment 1-2: 2 | treatment 1-1: 1.2 treatment 1-2: 2 |
|  | treatment 2: Cu: 15 g/L, Co: 8 g/L Ni: 8 g/L, pH 2, 40° C. | 25 | 1.2 |
| Comparative Example 15 | Cu: 15 g/L, Co: 8.5 g/L, Ni: 8.6 g/L, pH 2.5, 38° C. | 20 | 2.0 |

TABLE 4

|  | color difference ΔE | height of rougheing particles (10 points average) nm | thickness of rougheing particles (10 points average) nm | aspect ratio (height of rougheing particles/ thickness of rougheing particles) | glossines (TD) % | peel strength kg/cm | particle dropping | etching property | visiblity | wrinkles/ stripes during lamination | productivity |
|---|---|---|---|---|---|---|---|---|---|---|---|
| Example 1 | 44.52 | 89 | 20 | 4.5 | 45 | 0.74 | ◎ | ◎ | ○ | ◎ | ◎ |
| Example 2 | 46.20 | 113 | 38 | 3.0 | 36 | 0.74 | ◎ | ◎ | ○ | ◎ | ◎ |
| Example 3 | 48.94 | 258 | 53 | 4.9 | 28 | 0.75 | ◎ | ◎ | ○ | ◎ | ◎ |
| Example 4 | 49.92 | 312 | 47 | 6.6 | 15 | 0.79 | ◎ | ◎ | ○ | ◎ | ◎ |
| Example 5 | 46.68 | 58 | 49 | 1.2 | 37 | 0.71 | ◎ | ◎ | ○ | ◎ | ◎ |
| Example 6 | 47.78 | 81 | 50 | 1.6 | 13 | 0.72 | ◎ | ◎ | ○ | ◎ | ◎ |
| Example 7 | 49.03 | 102 | 70 | 1.5 | 9 | 0.75 | ◎ | ◎ | ○ | ◎ | ◎ |
| Example 8 | 50.55 | 394 | 78 | 5.1 | 7 | 0.76 | ○ | ◎ | ○ | ◎ | ◎ |
| Example 9 | 49.68 | 466 | 91 | 5.1 | 5 | 0.77 | ○ | ◎ | ○ | ◎ | ○ |
| Example 10 | 53.76 | 699 | 95 | 7.4 | 4 | 0.80 | ○ | ◎ | ○ | ◎ | ○ |
| Example 11-1 | 50.81 | 523 | 83 | 6.3 | 4 | 0.81 | ○ | ◎ | ○ | ◎ | ○ |
| Example 11-2 | 48.00 | 582 | 98 | 5.9 | 3 | 0.79 | ○ | ◎ | ○ | ◎ | ○ |
| Example 11-3 | 51.00 | 684 | 105 | 6.5 | 2 | 0.81 | ○ | ◎ | ○ | ◎ | ○ |
| Example 11-4 | 53.24 | 723 | 101 | 7.2 | 2 | 0.8 | ○ | ◎ | ○ | ◎ | ○ |
| Example 11-5 | 55.88 | 890 | 159 | 5.6 | 1 | 0.82 | ○ | ◎ | ○ | ◎ | ○ |
| Example 12 | 45.92 | 99 | 43 | 2.3 | 30 | 0.72 | ◎ | ◎ | ○ | ◎ | ◎ |
| Example 13 | 47.55 | 93 | 53 | 1.8 | 10 | 0.76 | ◎ | ◎ | ○ | ◎ | ◎ |
| Example 14 | 49.21 | 187 | 66 | 2.8 | 7 | 0.77 | ◎ | ◎ | ○ | ◎ | ◎ |
| Example 15 | 49.83 | 366 | 72 | 5.1 | 6 | 0.77 | ◎ | ◎ | ○ | ◎ | ◎ |
| Example 16 | 51.32 | 425 | 80 | 5.3 | 6 | 0.79 | ○ | ◎ | ○ | ◎ | ○ |
| Example 17 | 55.95 | 781 | 89 | 8.8 | 1 | 0.80 | ○ | ◎ | ○ | ◎ | ○ |
| Example 18 | 57.54 | 989 | 105 | 9.4 | 0.3 | 0.81 | ○ | ◎ | ○ | ◎ | ○ |
| Example 19 | 48.27 | 179 | 13 | 13.8 | 31 | 0.78 | ◎ | ◎ | ○ | ◎ | ◎ |
| Example 20 | 50.24 | 208 | 21 | 9.9 | 20 | 0.78 | ○ | ◎ | ○ | ◎ | ◎ |
| Example 21 | 51.39 | 297 | 39 | 7.6 | 11 | 0.80 | ○ | ◎ | ○ | ◎ | ◎ |
| Example 22 | 51.22 | 335 | 56 | 6.0 | 4 | 0.81 | ○ | ◎ | ○ | ◎ | ○ |
| Example 23 | 56.87 | 402 | 86 | 4.7 | 3 | 0.80 | ○ | ◎ | ○ | ◎ | ○ |
| Example 24 | 42.11 | 6.1 | 13 | 0.5 | 70 | 0.58 | ◎ | ◎ | ○ | ○ | ◎ |
| Example 25 | 51.23 | 172 | 88 | 2.0 | 2 | 0.79 | ○ | ◎ | ○ | ◎ | ○ |
| Example 26 | 44.75 | 51 | 40 | 1.3 | 3 | 0.72 | ◎ | ◎ | ○ | ◎ | ◎ |
| Example 27 | 44.10 | 88 | 52 | 1.7 | 2 | 0.75 | ◎ | ◎ | ○ | ◎ | ◎ |
| Example 28 | 59.95 | 1080 | 580 | 1.9 | 2 | 0.80 | ○ | ◎ | ◎ | ◎ | ○ |
| Example 29 | 60.58 | 1298 | 594 | 2.2 | 1 | 0.80 | ○ | ◎ | ◎ | ◎ | ○ |
| Example 30 | 60.72 | 1035 | 693 | 1.5 | 1 | 0.81 | ○ | ◎ | ◎ | ◎ | ○ |
| Example 31 | 62.94 | 1126 | 720 | 1.6 | 1 | 0.81 | ○ | ◎ | ◎ | ◎ | ○ |
| Example 32 | 64.87 | 1207 | 793 | 1.5 | 1 | 0.80 | ○ | ○ | ◎ | ◎ | ○ |
| Example 33 | 65.96 | 1768 | 806 | 2.2 | 1 | 0.80 | ○ | ○ | ◎ | ◎ | ○ |
| Example 34 | 69.12 | 1943 | 1132 | 1.7 | 1 | 0.80 | ○ | ○ | ◎ | ◎ | ○ |
| Comparative Example 1 | 60.27 | 1024 | 250 | 4.1 | 2 | 0.82 | X | ◎ | ◎ | ◎ | X |
| Comparative Example 2 | 61.96 | 1250 | 378 | 3.3 | 1 | 0.81 | X | ○ | ◎ | ◎ | X |
| Comparative Example 3 | 60.37 | 1080 | 232 | 4.7 | 1 | 0.82 | X | ◎ | ◎ | ◎ | X |
| Comparative Example 4 | 62.77 | 1005 | 295 | 3.4 | 2 | 0.82 | X | ◎ | ◎ | ◎ | X |

TABLE 4-continued

|  | color difference ⊿E | height of rougheing particles (10 points average) nm | thickness of rougheing particles (10 points average) nm | aspect ratio (height of rougheing particles/ thickness of rougheing particles) | glossines (TD) % | peel strength kg/cm | particle dropping | etching property | visiblity | wrinkles/ stripes during lamination | productivity |
|---|---|---|---|---|---|---|---|---|---|---|---|
| Comparative Example 5 | 65.99 | 1223 | 341 | 3.6 | 1 | 0.82 | X | ○ | ◎ | ◎ | X |
| Comparative Example 6 | 66.23 | 1840 | 356 | 5.2 | 1 | 0.83 | X | ○ | ◎ | ◎ | X |
| Comparative Example 7 | 68.46 | 2024 | 382 | 5.3 | 1 | 0.82 | X | ○ | ◎ | ◎ | X |
| Comparative Example 8 | 41.09 | 2.5 | 3 | 0.8 | 89 | 0.12 | ◎ | ◎ | Δ | X | ◎ |
| Comparative Example 9 | 41.43 | 3.3 | 7 | 0.5 | 75 | 0.15 | ◎ | ◎ | Δ | X | ◎ |
| Comparative Example 10 | 40.29 | 2.1 | 4 | 0.5 | 94 | 0.11 | ◎ | ◎ | Δ | X | ◎ |
| Comparative Example 11 | 40.05 | 2 | 9 | 0.2 | 95 | 0.11 | ◎ | ◎ | Δ | X | ◎ |
| Comparative Example 12 | 41.38 | 2.8 | 9 | 0.3 | 82 | 0.12 | ◎ | ◎ | Δ | X | ◎ |
| Comparative Example 13 | 45.23 | 50 | 46 | 1.1 | 120 | 0.82 | ◎ | ◎ | ◎ | X | ◎ |
| Reference Example 14 | 45.87 | 2895 | 521 | 5.6 | 2 | 0.85 | ◎ | Δ | ○ | ◎ | ◎ |
| Comparative Example 15 | 67.81 | 1526 | 253 | 6.0 | 1 | 0.80 | X | ○ | ◎ | ◎ | X |

Example 19 to 23 refer to results for measurements of ultra-thin copper layer of a copper foil with carrier.

TABLE 5

|  | heat resistant layer | | rust preventive layer | weather resistant layer |
|---|---|---|---|---|
|  | 1 | 2 |  |  |
| Example 1 | Ni—Co | Ni—Zn | chromate | silane coupling treatment |
| Example 2 | Ni—Co | Ni—Zn | chromate | silane coupling treatment |
| Example 3 | Ni—Co | Ni—Zn | chromate | silane coupling treatment |
| Example 4 | Ni—Co | Ni—Zn | chromate | silane coupling treatment |
| Example 5 | Ni—Co (2) | Ni—Zn (2) | chromate | silane coupling treatment |
| Example 6 | Ni—Co (2) | Ni—Zn (2) | chromate | silane coupling treatment |
| Example 7 | Ni—Co (2) | Ni—Zn (2) | chromate | silane coupling treatment |
| Example 8 | Ni—Co (2) | Ni—Zn (2) | chromate | silane coupling treatment |
| Example 9 | Ni—Co | Ni—Zn | chromate | silane coupling treatment |
| Example 10 | Ni—Co | Ni—Zn | chromate | silane coupling treatment |
| Example 11-1 | Ni—Co | Ni—Zn | chromate | silane coupling treatment |
| Example 11-2 | Ni—Co | Ni—Zn | chromate | silane coupling treatment |
| Example 11-3 | Ni—Co | Ni—Zn | chromate | silane coupling treatment |
| Example 11-4 | Ni—Co | Ni—Zn | chromate | silane coupling treatment |
| Example 11-5 | Ni—Co | Ni—Zn | chromate | silane coupling treatment |
| Example 12 | Ni—Co (2) | Ni—Zn (2) | chromate | silane coupling treatment |
| Example 13 | Ni—Co (3) | Ni—Zn (3) | chromate | silane coupling treatment |
| Example 14 | Ni—Co (2) | Ni—Zn (2) | chromate | silane coupling treatment |
| Example 15 | Ni—Co (3) | Ni—Zn (3) | chromate | silane coupling treatment |
| Example 16 | Ni—Co | Ni—Zn | chromate | silane coupling treatment |
| Example 17 | Ni—Co | Ni—Zn | chromate | silane coupling treatment |
| Example 18 | Ni—P | Ni—W | chromate | silane coupling treatment |
| Example 19 | — | — | chromate | silane coupling treatment |
| Example 20 | — | — | chromate | silane coupling treatment |
| Example 21 | — | — | chromate | silane coupling treatment |
| Example 22 | — | — | chromate | — |
| Example 23 | — | — | — | silane coupling treatment |
| Example 24 | Ni—Co | Ni—Zn | chromate | silane coupling treatment |
| Example 25 | Ni—Co (2) | Ni—Zn (2) | chromate | silane coupling treatment |
| Example 26 | Ni—Co | Ni—Zn | chromate | silane coupling treatment |
| Example 27 | Ni—Co | Ni—Zn | chromate | — |
| Example 28 | Ni—Co | Ni—Zn | chromate | silane coupling treatment |
| Example 29 | Ni—Co | Ni—Zn | chromate | silane coupling treatment |
| Example 30 | Ni—Co | Ni—Zn | chromate | silane coupling treatment |
| Example 31 | Ni—Co | Ni—Zn | chromate | silane coupling treatment |

TABLE 5-continued

|  | heat resistant layer | | rust preventive layer | weather resistant layer |
|---|---|---|---|---|
|  | 1 | 2 | | |
| Example 32 | Ni—Co | Ni—Zn | chromate | silane coupling treatment |
| Example 33 | Ni—Co | Ni—Zn | chromate | silane coupling treatment |
| Example 34 | Ni—Co | Ni—Zn | chromate | silane coupling treatment |
| Comparative Example 1 | — | — | chromate | silane coupling treatment |
| Comparative Example 2 | — | — | chromate | silane coupling treatment |
| Comparative Example 3 | — | — | chromate | silane coupling treatment |
| Comparative Example 4 | — | — | chromate | silane coupling treatment |
| Comparative Example 5 | — | — | chromate | silane coupling treatment |
| Comparative Example 6 | — | — | chromate | silane coupling treatment |
| Comparative Example 7 | — | — | chromate | silane coupling treatment |
| Comparative Example 8 | — | — | chromate | silane coupling treatment |
| Comparative Example 9 | — | Ni—Zn | chromate | silane coupling treatment |
| Comparative Example 10 | — | Ni—Zn(2) | chromate | silane coupling treatment |
| Comparative Example 11 | — | Ni—Zn(3) | chromate | silane coupling treatment |
| Comparative Example 12 | — | Ni—W | chromate | silane coupling treatment |
| Comparative Example 13 | — | — | chromate | silane coupling treatment |
| Reference Example 14 | — | — | chromate | silane coupling treatment |
| Comparative Example 15 | Ni—Co | Ni—Zn | chromate | — |

(Evaluation Results)

In each of Examples 1 to 34, the aspect ratio of roughening particles of the roughening treatment layer satisfied one or more of the following items (1) and (2), the aspect ratio being "a height of the roughening particles"/"a thickness of the roughening particles":

(1) the aspect ratio of the roughening particles is 3 or less,
(2) the aspect ratio of the roughening particles satisfies any one of the following items (2-1) or (2-2):
  (2-1) the aspect ratio of the roughening particles is 10 or less in the case that the height of the roughening particles is more than 500 nm and 1000 nm or less,
  (2-2) the aspect ratio of the roughening particles is 15 or less in the case that the height of the roughening particles is 500 nm or less.

Further, in each of Examples 1 to 34, the glossiness was 70% or less.

Therefore, in each of Examples 1 to 34, a dropping of the roughening particles from a roughening treatment layer provided on the surface of the copper foil was favorably suppressed and an occurrence of wrinkles or stripes when bonding with a resin was favorably suppressed.

Each of Comparative Examples 1 to 7, 15 satisfes neither the above item (1) nor the above item (2). Therefore, Comparative Examples 1 to 7, 15 were unsuitable from the viewpoint of particle dropping.

In each of Comparative Examples 8 to 13, the glossiness exceeded 70%. Therefore, in Comparative Examples 8 to 13, an occurrence of wrinkles or stripes when bonding with a resin wasn't favorably suppressed.

In the present application, the priority of Japanese Patent Application No. 2017-070418 filed on Mar. 31, 2017 is claimed, and the entire contents of the Japanese Patent Application are incorporated in the present application by reference.

The invention claimed is:

1. A surface treated copper foil, comprising
   a copper foil, and
   a roughening treatment layer on at least one surface of the copper foil,
   wherein an aspect ratio of roughening particles of the roughening treatment layer satisfies one or more of the following items (1) and (2), the aspect ratio being a height of the roughening particles/a thickness of the roughening particles:
(1) the aspect ratio of the roughening particles is 3 or less and the height of the roughening particles is 1943 nm or less,
(2) the aspect ratio of the roughening particles satisfies any one of the following items (2-1) or (2-2):
(2-1) the aspect ratio of the roughening particles is 10 or less in the case that the height of the roughening particles is more than 500 nm and 1000 nm or less, (2-2) the aspect ratio of the roughening particles is 15 or less in the case that the height of the roughening particles is 500 nm or less; and
a glossiness of a TD of the surface of the side of the roughening treatment layer of the surface treated copper foil is 70% or less.

2. The surface treated copper foil according to claim 1, wherein a color difference ΔE*ab according to JIS Z 8730 of a surface of a side of the roughening treatment layer of the surface treated copper foil is 65 or less.

3. The surface treated copper foil according to claim 1, wherein the height of the roughening particles is 1000 nm or more and 1943 nm or less and the aspect ratio of the roughening particles is 3.0 or less.

4. The surface treated copper foil according to claim 1, wherein the height of the roughening particles is 500 nm or more and 1943 nm or less and the aspect ratio of the roughening particles is 10.0 or less.

5. The surface treated copper foil according to claim 1, wherein the height of the roughening particles is 500 nm or less and the aspect ratio of the roughening particles is 1.9 or less.

6. The surface treated copper foil according to claim 1, wherein the aspect ratio of the roughening particles satisfies one or more of the items (1) and (2-2), and the height of the roughening particles is 400 nm or less.

7. The surface treated copper foil according to claim 1, wherein the height of the roughening particles is 1200 nm or less.

8. The surface treated copper foil according to claim 1, wherein the color difference $\Delta E^*ab$ according to JIS Z 8730 of the surface of the side of the roughening treatment layer is 45 or more and 65 or less.

9. The surface treated copper foil according to claim 1, wherein the color difference $\Delta E^*ab$ according to JIS Z 8730 of the surface of the side of the roughening treatment layer is 50.0 or less.

10. The surface treated copper foil according to claim 1, wherein the glossiness of the TD of the surface of the side of the roughening treatment layer is 21% or more and 70% or less.

11. The surface treated copper foil according to claim 1 comprising,
on the surface of the roughening treated layer, one or more layers selected from the group consisting of a heat resistant layer, a rust preventive layer, a chromate treatment layer and a silane coupling treatment layer.

12. The surface treated copper foil according to claim 1, wherein the surface treated copper foil is for heat dissipation.

13. A surface treated copper foil with resin layer, comprising
the surface treated copper foil according to claim 1, and a resin layer on the surface of the side of the roughening treatment layer.

14. The surface treated copper foil with resin layer according to claim 13,
wherein the resin layer is an adhesive resin and/or a semi-cured resin.

15. A copper foil with carrier, comprising
a carrier,
an intermediate layer, and
an ultra-thin copper layer,
wherein the ultra-thin copper layer is the surface treated copper foil according to claim 1 or a surface treated copper foil with resin layer, comprising the surface treated copper foil according to claim 1, and a resin layer on the surface of the side of the roughening treatment layer.

16. A laminate, comprising the surface treated copper foil according to claim 1.

17. A laminate, comprising the copper foil with carrier according to claim 15.

18. A laminate, comprising the copper foil with carrier according to claim 15 and a resin,
wherein a part or the whole of an end face of the copper foil with carrier is covered with the resin.

19. A laminate, comprising two of the copper foils with carrier according to claim 15.

20. A method for manufacturing a printed wiring board, using the surface treated copper foil according to claim 1.

21. A method for manufacturing a printed wiring board, comprising
a step of forming a copper clad laminate comprising any one of the following steps (21-1) to (21-4):
(21-1) a step of laminating the surface treated copper foil according to claim 1 and an insulating substrate,
(21-2) a step of laminating a surface treated copper foil with resin layer, comprising the surface treated copper foil according to claim 1, and a resin layer on the surface of the side of the roughening treatment layer and an insulating substrate,
(21-3) a step of laminating a copper foil with carrier, comprising a carrier, an intermediate layer, and an ultra-thin copper layer, wherein the ultra-thin copper layer is the surface treated copper foil according to claim 1, and an insulating substrate, and then peeling off the carrier of the copper foil with carrier,
(21-4) a step of laminating a copper foil with carrier, comprising a carrier, an intermediate layer, and an ultra-thin copper layer, wherein the ultra-thin copper layer is a surface treated copper foil with resin layer, comprising the surface treated copper foil according to claim 1, and a resin layer on the surface of the side of the roughening treatment layer, and an insulating substrate, and then peeling off the carrier of the copper foil with carrier; and
a step of forming a circuit by a semi-additive method, a subtractive method, a partly additive method or a modified semi-additive method using the copper clad laminate.

22. A method for manufacturing a printed wiring board, comprising
a step of forming a circuit on the surface of the side of the roughening treatment layer of the surface treated copper foil according to claim 1, or on a surface of a copper foil with carrier, comprising a carrier, an intermediate layer, and an ultra-thin copper layer, wherein the ultra-thin copper layer is the surface treated copper foil according to claim 1;
a step of forming a resin layer on the surface of the surfaced treated copper foil, or on the surface of the copper foil with the carrier, so that the circuit is embedded in the resin layer;
a step of forming a circuit on the resin layer; and
after forming the circuit on the resin layer, a step of exposing the circuit embedded in the resin layer by removing the surface treated copper foil, or by peeling off the carrier or the ultra-thin copper layer and then removing the ultra-thin copper layer or the carrier.

23. A method for manufacturing a printed wiring board, comprising
a step of laminating the copper foil with carrier according to claim 15 and a resin substrate;
a step of forming, at least once, a resin layer and a circuit on a surface of the copper foil with carrier, the surface being on the side opposite to the side on which the resin substrate is laminated; and
after forming the resin layer and the circuit, a step of peeling off the carrier or the ultra-thin copper layer from the copper foil with carrier.

24. A method for manufacturing a printed wiring board, comprising
a step of forming, at least once, a resin layer and a circuit on at least one of surfaces of a laminate according to any one of the following items (24-1) to (24-3),
(24-1) a laminate comprising the copper foil with carrier according to claim 15, (24-2) a laminate comprising the copper foil with carrier according to claim 15 and a resin, wherein a part or the whole of an end face of the copper foil with carrier is covered with the resin, (24-3) a laminate comprising two of the copper foils with carrier according to claim 15: and after forming the resin layer and the circuit, a step of peeling off the carrier or the ultra-thin copper layer from the copper foil with carrier constituting the laminate.

25. A method for manufacturing an electronic device, using a printed wiring board manufactured by the method according to claim 20.

* * * * *